US008539416B1

(12) United States Patent
Rossman et al.

(10) Patent No.: US 8,539,416 B1
(45) Date of Patent: Sep. 17, 2013

(54) METHODS, SYSTEMS, AND ARTICLES OF MANUFACTURE FOR CREATING A HIERARCHICAL OUTPUT FOR AN OPERATION IN AN ELECTRONIC DESIGN

(75) Inventors: Sabra Rossman, Bellevue, WA (US); Mark Rossman, Bellevue, WA (US)

(73) Assignee: Cadence Design Systems, Inc., San Jose, CA (US)

( * ) Notice: Subject to any disclaimer, the term of this patent is extended or adjusted under 35 U.S.C. 154(b) by 398 days.

(21) Appl. No.: 12/649,658

(22) Filed: Dec. 30, 2009

(51) Int. Cl.
*G06F 17/50* (2006.01)
(52) U.S. Cl.
USPC ............................. 716/119; 716/118; 716/124
(58) Field of Classification Search
USPC ................................................ 716/119, 124
See application file for complete search history.

(56) References Cited

U.S. PATENT DOCUMENTS

| | | | |
|---|---|---|---|
| 6,453,452 B1 * | 9/2002 | Chang et al. | 716/53 |
| 6,931,613 B2 | 8/2005 | Kauth et al. | |
| 7,240,321 B2 | 7/2007 | Cobb et al. | |
| 2003/0018948 A1 | 1/2003 | Chang et al. | |
| 2006/0236299 A1 | 10/2006 | Sahouria et al. | |
| 2006/0277520 A1 * | 12/2006 | Gennari | 716/21 |
| 2007/0011636 A1 | 1/2007 | Seidl et al. | |
| 2008/0109772 A1 | 5/2008 | Pokorny | |
| 2008/0256500 A1 | 10/2008 | Cobb et al. | |
| 2009/0001337 A1 | 1/2009 | Furukawa et al. | |

OTHER PUBLICATIONS

Non-Final Office Action dated Oct. 6, 2011 for U.S. Appl. No. 12/649,643.
Final Office Action dated May 1, 2012 for U.S. Appl. No. 12/649,643.
Non-Final Office Action dated Aug. 28, 2012 for U.S. Appl. No. 12/649,643.
Non-Final Office Action dated Nov. 21, 2011 for U.S. Appl. No. 12/713,819.
Final Office Action dated May 10, 2012 for U.S. Appl. No. 12/713,819.

* cited by examiner

*Primary Examiner* — Vuthe Siek
*Assistant Examiner* — Eric Lee
(74) *Attorney, Agent, or Firm* — Vista IP Law Group, LLP

(57) ABSTRACT

Disclosed are methods, systems, and articles of manufacture for processing a electronic design, which use a computer system to identify an operation associated with a task to be performed on the electronic design, to generate a hierarchical output for multiple shapes for performing the task based at least in part on performing an operation associated with the task, and to display or to store the hierarchical output. The task comprises a dummy fill insertion task or a design verification task in some embodiments. The methods or the systems may further determine or identify an inverse transform and apply the inverse transform to a shape before adding the shape to the hierarchical output. In some embodiments, there exists no duplication among the shapes in the hierarchical output.

22 Claims, 17 Drawing Sheets

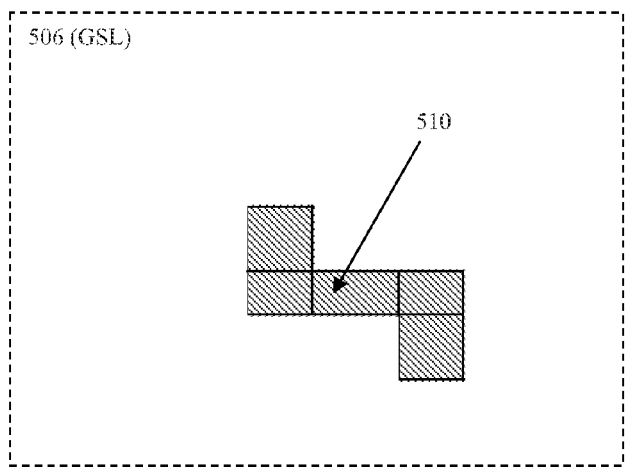
(E)
FIG. 5
(continue)
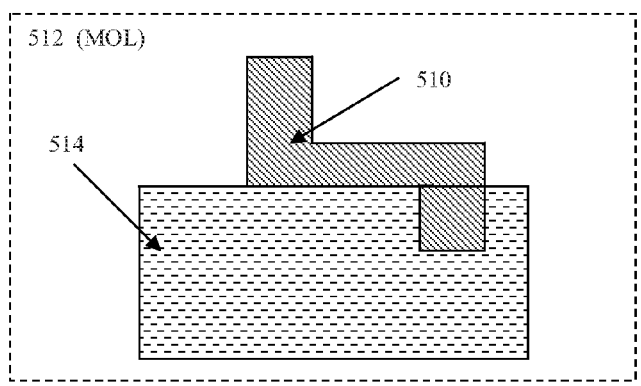
(F)
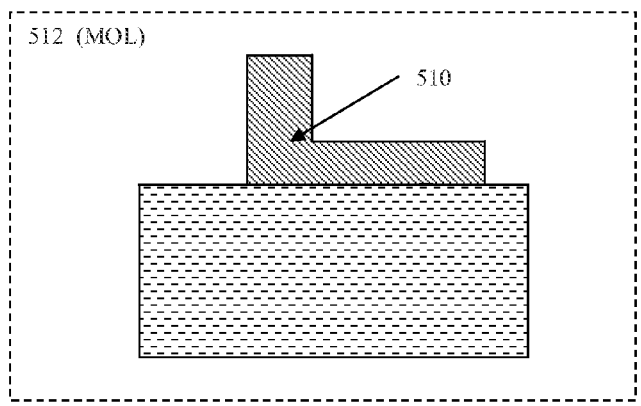
(G)

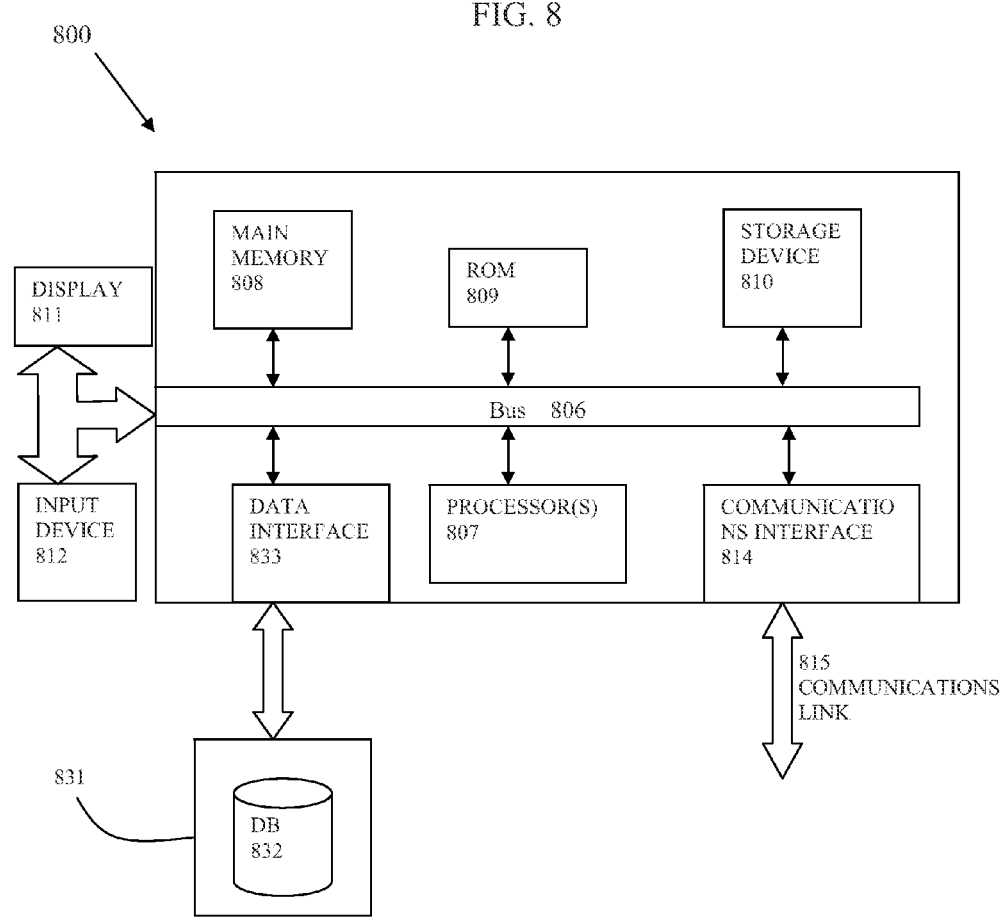

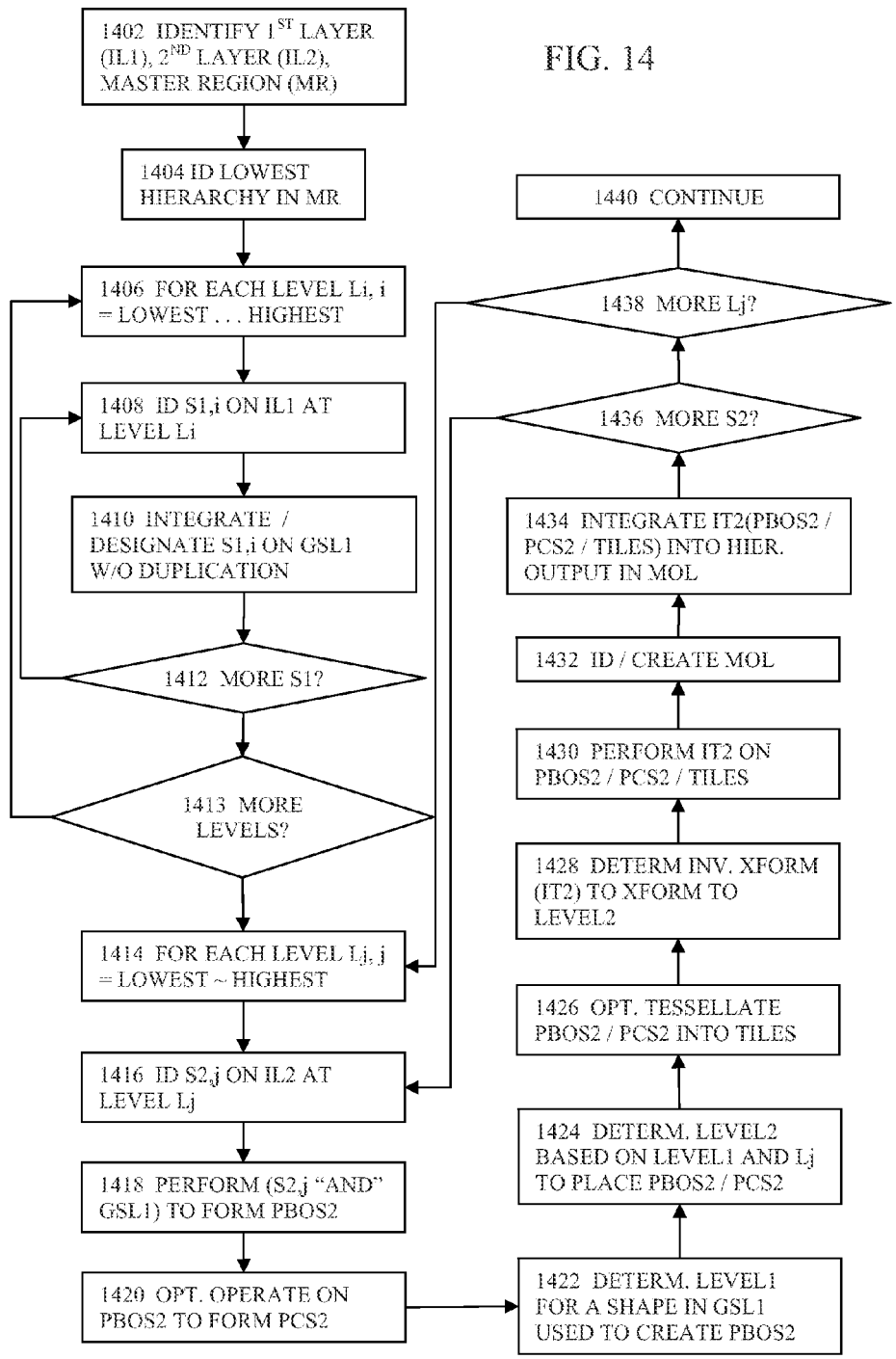

METHODS, SYSTEMS, AND ARTICLES OF MANUFACTURE FOR CREATING A HIERARCHICAL OUTPUT FOR AN OPERATION IN AN ELECTRONIC DESIGN

CROSS-REFERENCE TO RELATED APPLICATIONS

Certain aspects in some embodiments of this Application are related to and disclosed in U.S. application Ser. No. 12/649,643, entitled "METHODS, SYSTEMS, AND ARTICLES OF MANUFACTURE FOR CREATING A HIERARCHICAL OUTPUT FOR AN OPERATION IN AN ELECTRONIC DESIGN" and was filed concurrently, the contents of which are incorporated by reference in their entirety in this Application.

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

The invention relates to technology for designing and verifying an integrated circuit ("IC") or electronic circuit design.

A semiconductor integrated circuit (IC) or an electronic circuit has a large number of electronic components, such as transistors, logic gates, diodes, wires, etc., that are fabricated by forming layers of different materials and of different geometric shapes on various regions of a silicon wafer.

Many phases of physical design may be performed with computer aided design (CAD) tools or electronic design automation (EDA) systems. To design an electronic circuit, a designer first creates high level behavior descriptions of the electronic circuit device using a high-level hardware design language. An EDA system typically receives the high level behavior descriptions of the electronic circuit device and translates this high-level design language into netlists of various levels of abstraction using a computer synthesis process. A netlist describes interconnections of nodes and components on the chip and includes information on circuit primitives such as transistors and diodes, their sizes and interconnections, for example.

An electronic circuit designer may use a set of EDA application programs to create a physical electronic circuit design layout from a logical circuit design. The EDA application uses geometric shapes of different materials to create the designs of the various electrical components in an electronic circuit and to represent electronic circuit components as geometric objects with varying shapes and sizes. Typically, geometric information about the placement of the nodes and components onto the chip is determined by a placement process and a routing process. The placement process is a process for placing electronic component design and/or circuit design blocks on the chip and the routing process is the process for creating interconnections between the blocks and components according to the specified netlist. In a typical electronic circuit design flow, routing involves assigning wires and vias to create a circuit connection.

In the Integrated Circuit (IC) design, electronic components and wiring are represented by a set of geometric shapes and patterns from a physical perspective. Electronic design automation (EDA) tools interact with these shapes and patterns throughout the IC design and verification process. The electronic circuit design then goes through various stages of verification and optimization via a set of EDA testing and analysis tools. Verification may include, for example, design rule checking (DRC) to verify whether or not various electronic circuit parameters comply with various design rules that are established for the respective electronic circuit parameters. For example, the patterns and shapes in the design are routinely checked with the Design Rules—Design Rules Checking (DRC). Design rules are a series of parameters provided by semiconductor manufacturers, specifying geometric and connectivity restrictions to ensure sufficient margins to account for variability in semiconductor manufacturing processes.

DRC enables a designer to verify the correctness of his or her design and to achieve a high overall yield and reliability for the design. In other words, a routing solution, for example, is usually driven by various design rules against which the electronic design may be checked and a set of requirements such as spacing requirements between two or more objects and routing object size requirements. The routing applications such as a router then ensure that these design rules and various sets of requirements are met in order to have a working electronic circuit. For example, DRC governs how an object has to be spaced relative to another object and to meet the width requirement. That is, after the physical mask layout is generated for an electronic circuit, the layout is measured by a set of constraints, rules, or requirements, such as geometric constraints or rules for the particular processes the electronic circuit is designed to perform, to ensure high yield and reliability by verifying that the electronic design meets the process constraints.

An electronic circuit often comprises a plurality of blocks or modules which are highly state-dependent because the actions of the plurality of blocks or modules depend not only on their inputs but also on what events have previously happened. The electronic circuit components, or, more precisely, the geometries in the electronic circuit design in a verification flow, such as a design rule checking process, are usually grouped into layers. Depending upon the type of verification operations, typical examples of such layers comprise drawn layers which represent the original layout data, polygon layers each of which constitutes the output of a layer creation operation such as a Boolean operation, an area function, or a polygon operation. Typical examples of such layers may also comprise edge layers, each of which represents one or more edges of merged polygons as outputted by operations such as some measurement operations. Another exemplary layer is an error layer which comprises a set of one or more edges from a measurement operation.

Such a hierarchical design for an electronic circuit defines the underlying circuit as a plurality of smaller modules, blocks, cells, or cellviews, each of which may be further broken down to comprise another set of even smaller sub-modules or sub-blocks and eventually down to individual circuit elements or components such as individual pieces of interconnects. This hierarchical nature of the electronic design allows the circuit designers not only to consider the entire electronic circuit in a modular way but also to consider each of the modules, blocks, sub-modules, sub-blocks, or the individual circuit elements individually, if desired. In addition, this hierarchical design allows for scoping for variable declaration, procedure calls, and/or policy determination for each of the various levels in the hierarchy.

Conventional approaches for verification of electronic circuits such as language-based DRC or image-based DRC operate upon a flat design. It is noted that a flat design may be considered as an electronic design with one cell in the sense that every circuit element in the electronic design belongs to the single cell. With these conventional approaches, a cell-based hierarchical input for an electronic design is flattened, and the entire design is internally represented as one large cell. The language-based DRC (such as a rule-based DRC or a model-based DRC) or an image-based DRC is then performed against this flattened design.

Compared to flat designs, hierarchical designs offer various advantages such as containing a potential state or transition explosion problem when composing sub-states, capability and relative ease in modeling complex hierarchical control flow with transitions spanning different levels of the behaviors of the electronic circuit, and the capability of multi-thread computation, all of which are known, typical problems of a flat design. In addition, a flat design has been well known to be ill suited for parallelization and multi-threaded computation.

On the other hand, the complex interactions between multiple elements which may even belong to multiple layers in the hierarchy of the electronic design have imposed an almost insurmountable barrier to performing verification of hierarchical electronic circuit designs because analyzing such a hierarchical design is know to be NPC (nondeterministic polynomial time-complete) in the size of the hierarchical design. This barrier is further exacerbated by the choice of hierarchy in a given electronic circuit design because circuit designers often determine the hierarchies based on factors or reason completed unrelated to verification. For example, a circuit designer may determine the hierarchies of an electronic circuit design based on the ease of logical understanding of the circuit functions.

In addition, insertion of metal fills or dummy fills (hereinafter, the fill structures) is a technique that is commonly used to enhance integrity and assure planarity of the deposited layers on an electronic circuit. Without the support of the fill structures, undesired topological variations, such as variation in thickness uniformity, copper dishing or erosion due to one or more patterns in the vicinity in a CMP (chemical mechanical polishing) process, etc. may occur and negatively affect the electronic circuit in terms of yield, performance, etc. The fill structures are thus inserted into the electronic design to address these issues and typically include many pieces. The insertion of the fill structures often involves one or even multiple layers in the electronic circuit.

Nonetheless, conventional approaches invariably utilize the geometries in the cell(s) or cellview(s) to process the Boolean operations, which are often included in the insertion of metal or dummy fill or in the language-based or image-based design rule checking, and generate the output of the Boolean operations in a flat structure and are incapable of generating the output of the Boolean operations in a hierarchical structure. This flat structure of the output of the Boolean operations causes a potential state or transition explosion problem when composing sub-states, and is incapable of modeling complex hierarchical control flow with transitions spanning different levels of the behaviors of the electronic circuit.

Therefore, there exists a need for a method, a system, and an article of manufacture for creating a hierarchical output for a Boolean operation which is operated upon an electronic design.

SUMMARY

Disclosed are various embodiments of methods, systems, and articles of manufactures for creating a hierarchical output for a Boolean operation which is operated upon an electronic design.

In a single embodiment or in some embodiments of the method or the system for creating a hierarchical output for a Boolean operation which is operated upon an electronic design comprise the acts or hardware modules for using one or more master output layers (MOLs), one or more master regions, one or more global scratch layers (GSLs) to create a hierarchical output for one or more Boolean operations associated with a task that is or is to be performed on the electronic circuit design. In a single embodiment or in some embodiments of the method or the system for creating a hierarchical output for a Boolean operation which is operated upon an electronic design are implemented by utilizing an inverse transform, one or more clipping and other logical operations, and a tessellation process to create the hierarchical output for the one or more Boolean operations associated with the task. More details about the methods, systems, and articles of manufactures will be described in the following paragraphs.

BRIEF DESCRIPTION OF THE FIGURES

The drawings illustrate the design and utility of preferred embodiments of the present invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which:

FIG. 8 illustrates a block diagram of an illustrative computing system suitable for implementing various embodiments of the invention.

FIGS. 12-14 illustrate some exemplary and more detailed flow diagrams for the methods or systems for creating a hierarchical output for an operation associated with a task.

DETAILED DESCRIPTION

Various embodiments of the invention are directed to a method, system, and computer program product for creating a hierarchical output for an operation which is or is to be operated upon an electronic design for the performance of a task on the electronic circuit. Other objects, features, and advantages of the invention are described in the detailed description, figures, and claims.

Various embodiments of the methods, systems, and articles of manufacture will now be described in detail with reference to the drawings, which are provided as illustrative examples of the invention so as to enable those skilled in the art to practice the invention. Notably, the figures and the examples below are not meant to limit the scope of the present invention. Where certain elements of the present invention can be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, the present invention encompasses present and future known equivalents to the components referred to herein by way of illustration.

Figure 1:
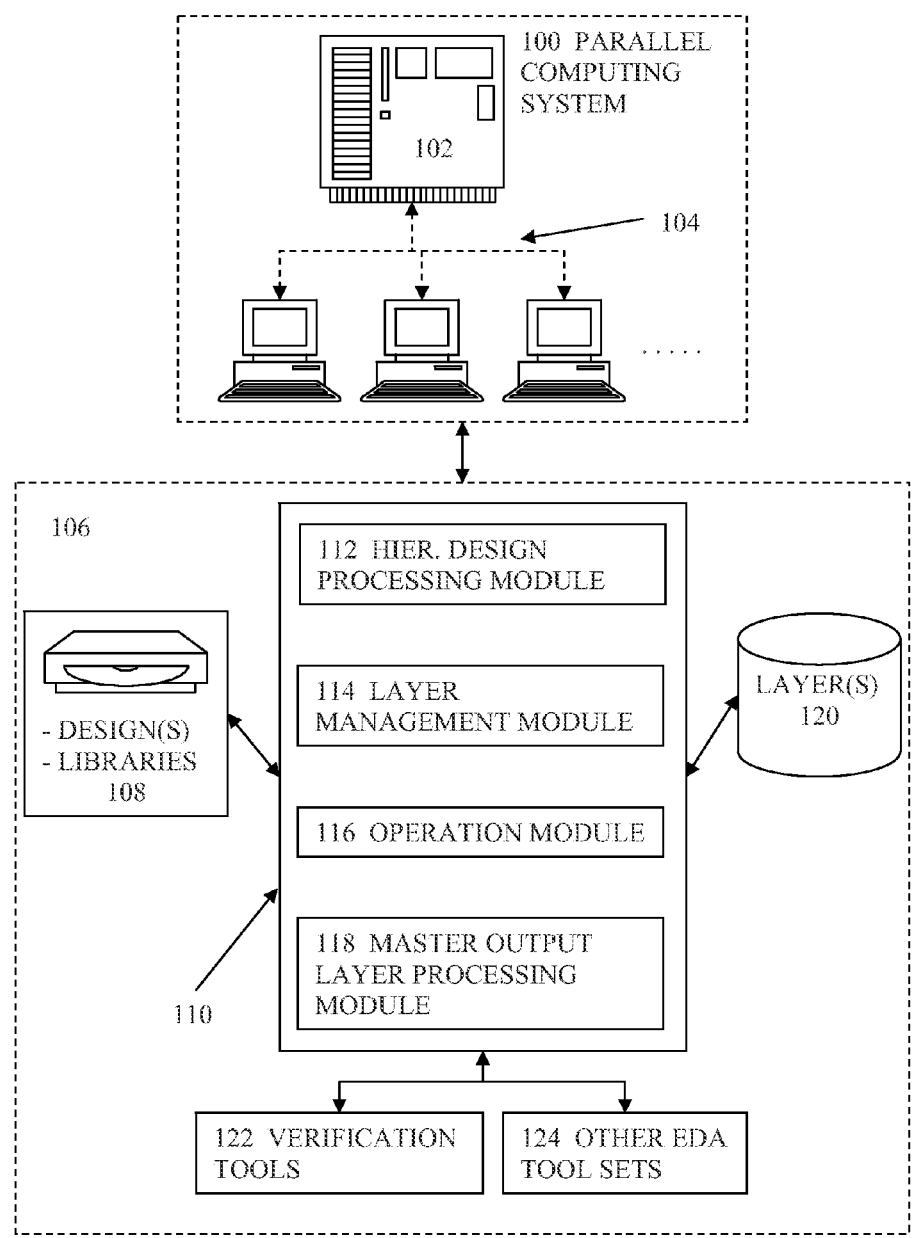
FIG. 1 illustrates an exemplary computing system for implementing the process for creating a hierarchical output for an operation which is or is to be operated upon an electronic design for the performance of a task on the electronic circuit.

With reference to FIG. 1 which illustrates an exemplary computing system for implementing the process for creating a hierarchical output for an operation which is or is to be operated upon an electronic design for the performance of a task on the electronic circuit, the computing system 100 comprises a master computing node 102 and one or more slave computing nodes 104 in some embodiments. In some embodiments, the computing system comprises a scalable multithreading parallel system with one or more central processing units (CPUs) where multiple threads share the computing resources such as the computing units, the CPU caches, and the translation lookaside buffer to achieve faster overall execution of the acts by, for example, increasing utilization of a processor core by leveraging thread-level and instruction-level parallelism. In these embodiments, the CPUs may comprise one or more processor cores, and at least one of the process cores is capable of multi-thread computation. In other embodiments, the computing system 100 may comprise a single computing system with one or more central processing unit (CPU) each of which comprises one or more processing cores, at least one of which is capable of multi-thread computation.

In the embodiments where the computing system comprises a master computing node 102 and one or more slave computing nodes 104, the master computing node is responsible for dividing the hierarchical electronic circuit design or a portion (such as a master region or a region of interest) into a plurality of sub-regions. The master computing node also spawns and initiates the one or more slave computing nodes 104. More details of dividing the electronic circuit design or a portion thereof are described in greater details in the following paragraphs.

106 of FIG. 1 illustrates an exemplary EDA (electronic design automation) tool set which comprises design contents 108 that are temporarily or permanently stored in one or more computer readable storage media, one or more computer storage devices, or a combination thereof. The design contents comprise, for example, one or more electronic circuit designs and libraries (such as design libraries, reference libraries, standard cell libraries, etc.)

The EDA tool set also comprises the processing module 110 for creating a hierarchical output for an operation in an electronic design. The hierarchical processing module 110 comprises the hierarchical design processing module 112 which will be described in greater details in subsequent paragraphs. The hierarchical processing module 110 also comprises a layer management module 114, an operation module 116, and a master output layer processing module 118, all of which will also be described in greater details in subsequent paragraphs.

The hierarchical processing module 110 is communicatively coupled to the one or more layers that are stored in one or more temporary or permanent computer readable storage media, one or more computer storage devices, or a combination thereof (120). The hierarchical processing module 110 interacts with the one or more layers to achieve the intended purposes according to various embodiments of the invention. More details about the interactions between the hierarchical processing module 110 and the one or more layers 120 will be described in greater details in subsequent paragraphs. The hierarchical processing module 110 also interacts with the communicatively coupled design contents 108 to, for example, read or import the hierarchical electronic circuit design (or a portion thereof) and the needed libraries either dynamically or statically.

The hierarchical processing module 110 uses the one or more layers 120 to perform various processes in 112, 114, 116, and 118 on the computing system 100 in some embodiments. The hierarchical processing module 110 is also communicatively coupled with verification tools 122 or other EDA tool sets 124 (such as a dummy fill insertion module) to further perform other functions such as physical verification or dummy fill insertion with the hierarchical output generated by the hierarchical processing module 110. Various tasks in 106, such as some or all of the tasks in modules 112, 114, 116, 118, 122, and 124, may be performed on the computing system 100 as described above.

Figure 2:
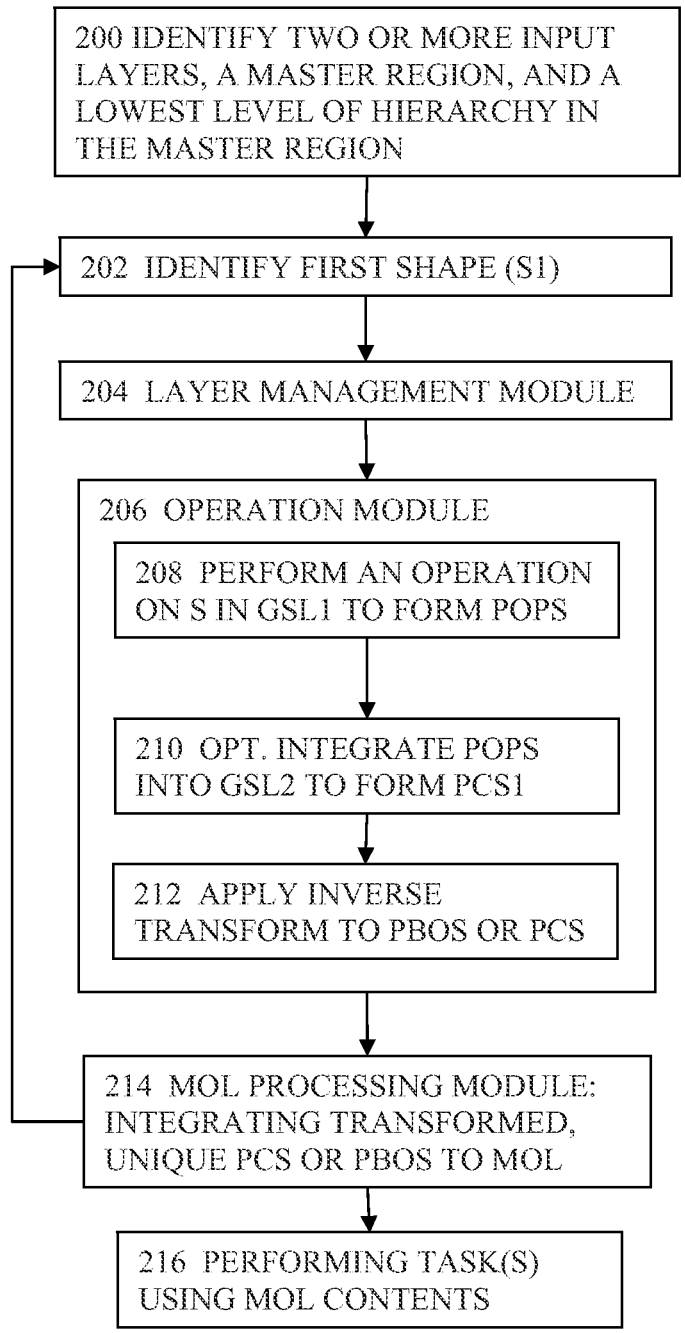
FIG. 2 illustrates a top level diagram for the methods and systems for generating a hierarchical output for an operation which is or is to be operated upon an electronic design for the performance of a task on the electronic circuit.

With reference to FIG. 2 which illustrates a top level diagram for the methods and systems for generating a hierarchical output for an operation which is or is to be operated upon an electronic design for the performance of a task on the electronic circuit, the method or the system for creating a hierarchical output for an operation in an electronic circuit design comprises identifying a first shape (S1) at a first hierarchical level in a first layer in some embodiments 202. Note that the first hierarchical level may be any hierarchical level in the hierarchy and does not necessarily correspond to the highest or the lowest level of hierarchy in the hierarchical structure of the electronic design. Also note that the first layer may comprise any number of hierarchical levels.

The method or the system for creating a hierarchical output for an operation further comprises a layer management module 204 which performs functions such as identification or creation of global scratch layer(s) (GSL) or the master output layer(s) (MOL) or functions such as removal of contents from one or more layers.

The method or the system for creating a hierarchical output for an operation further comprises the operation module 206 which performs functions such as performing an operation on the identified shape S1 in a first global scratch layer (GSL1) to form the first post operation shape (POPS) (208) in some embodiments. For example, the methods or the systems may perform a Boolean operation such as a Boolean AND operation or a logical conjunction between the first shape instance S1 and existing shapes in the first global scratch layer.

In these embodiments, the methods and systems for generating a hierarchical output for an operation may also identify the operation based at least in part upon one or more tasks that may utilize the hierarchical output generated by the process as described in FIG. 2. For example, the methods and systems for generating a hierarchical output for an operation may determine the type(s) of operations needed for, for example, a physical verification or dummy fill that may use the hierarchical output generated by the process as illustrated in FIG. 2. As a more specific example, if the methods or the systems determines that a subsequent dummy fill insertion process requires the union of all the shapes in a particular region on a specific level of the electronic circuit design, the methods or the systems may determine the operation to be a logical conjunction (Boolean AND operation) for the shapes on the specific level(s) and then perform the various processes as described herein.

The operation module 206 may also perform the function of integrating the first post operation shape (POPS) on a second global scratch layer (GSL2) to form the first post clipping shape (PCS1) at 210 and applying an inverse transform to the first post clipping shape at 212 to determine the location that the first post clipping shape would have if it is placed in the electronic circuit design. Note that the inverse transform maps or transforms the identified shape instance S1 to the location it would have if the cellview master associated with S1 is placed at the origin in some embodiments.

The following codes demonstrate an exemplary inverse transform in some embodiments. The copyright owner has no objection to the facsimile reproduction by anyone of the patent document or the patent disclosure, as it appears in the Patent and Trademark Office patent file or records, but otherwise reserves all copyright rights whatsoever.

```
void
msiBoolean::getTransformForShape(ctuShape *shape,
            int depth,
            oaTransform &xform)
{
  xform.init( );
  if (depth == 0) {
    return;
  }
  instance was at 0,0
    for (int i = 0; i < depth; i++) {
      ctuShape *object = shape->instPath(i);
      oaTransform tmpXform;
      tmpXform.init( );
      if (object->isArrayInstance( )) {
        ctuArrayInstance *aInst = object->asArrayInstance( );
        oaUInt4 r = shape->row(i);
        oaUInt4 c = shape->col(i);
        aInst->getTransform(r, c, tmpXform);
      } else {
        object->getTransform(tmpXform);
      }
```

-continued

```
      tmpXform.concat(xform);
      xform = tmpXform;
    }
  xform.invert( );
}
```

The method or the system for creating a hierarchical output for an operation may also comprise a master output layer processing module (214) which performs the function of integrating the inversely transformed first post clipping shape (PCS1) to the master output layer. In some embodiments, the act of integrating the inversely transformed first post clipping shape (PCS1) to the master output layer comprises clipping the first post clipping shape instance PCS1 against one or more shapes that already exist in the master output layer to ensure that the master output layer comprises unique shapes without duplication or without shape instances covering the same area of the electronic circuit design. Once the action of adding the first post operation shape instance to the master output layer is complete, the methods and systems for generating a hierarchical output for an operation may then iteratively loop back to 202 to identify another shape and to repeat the actions at 202, 204, and 206 until all the desired shapes at the desired level(s) are processed accordingly in some embodiments.

In addition or in the alternative, the method or the system for creating a hierarchical output for an operation may further comprise performing one or more tasks on a region of interest or on the entire electronic circuit design by using the contents of the master output layer (MOL) at 216. More details of the above modules and processes in 202, 204, 206, 208, 210, 212, 214, and 216 will be described in greater details in the subsequent paragraphs and other figures. For example, the methods and systems for generating a hierarchical output for an operation may invoke a physical verification EDA tool set or a dummy fill insertion tool set to respectively perform physical verification and dummy fill insertion in parallel or in a distributed computing environment by using the hierarchical output generated by the methods or systems as illustrated in the preceding actions with reference to FIG. 2.

Figure 3:
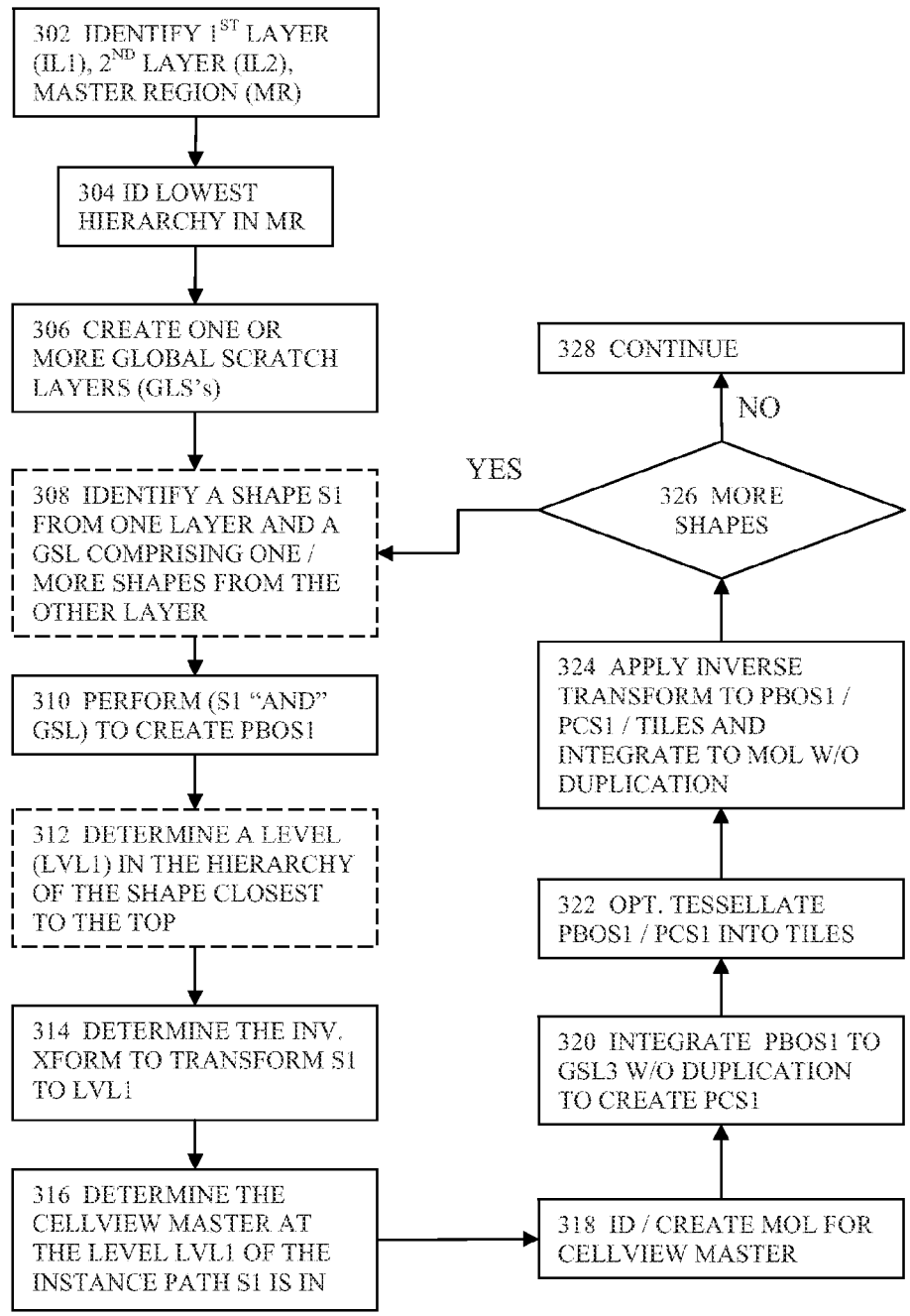
FIG. 3 illustrates a top level diagram for methods or systems for creating a hierarchical output for an operation associated with a task that is performed or is to be performed upon an electronic design.

Referring to FIG. 3 which illustrates a top level diagram for methods or systems for creating a hierarchical output for an operation associated with a task that is performed or is to be performed upon an electronic design. More specifically, FIG. 3 illustrates the top level diagram for the methods and systems for creating a hierarchical output for an AND Boolean operation which is or is to be operated upon multiple layers of the electronic design for the performance of the task. Note that in various embodiments, a layer refers to one of the stacking layers of materials with varying thicknesses of a semiconductor device such as metal layers. (M1, M2, etc.) A hierarchical level or simply a level of the electronic circuit design refers to one of a plurality of hierarchies, each of which represents the electronic circuit design at a different granularity in some embodiments. Further note that in various embodiments, a layer may comprise one or more hierarchical levels.

In a single embodiment or in some embodiments, the methods or the systems comprise the act or module for identifying a first layer (IL1), a second layer (IL2), and a master region (MR) at 302. The first layer and the second layer may be used as input layers, and the master region represents an area of interest in the electronic circuit design in the single embodiment or in some embodiments. The method or the system may further comprise the act or module of identifying the lowest hierarchical level of the electronic circuit design in the master region at 304 and creating one or more global scratch layers (GSL's) at 306 in some embodiments.

In some embodiments, the one or more scratch layers may be created as needed if it is determined that the requisite global scratch layers do not exist yet. That is, the method or the system may not necessarily create the one or more scratch layers if it is determined that the one or more scratch layers already exist. In some embodiments, the GSL's may be implemented in various computer readable storage media such as one or more disks, various forms of memories, or a combination of disk(s) and various tangible forms of memory. In some embodiments, the GSL may be implemented in any form of data structures such as one or more text files, ASCII codes, tables, relational or non-relational database tables, combination of any of the above, etc.

The method or the system further comprises the act or module of identifying a first shape (S1) from one of the first and the second input layer within the master region and a global scratch layer (GSL) that has been or will be populated with one or more shapes from the other layer at 308 in the single embodiment or in some embodiments. For example, the method or the system may identify the first shape (S1) from the first layer (IL1) and a scratch layer that has been populated with one or more shapes or that will be populated with one or more shapes from the second layer (IL2). More details about the act or module in 308 will be described in subsequent paragraphs with reference to FIGS. 9-14.

At 310, the method or the system comprises the act or module of performing a Boolean operation between the first shape and the identified scratch layer to create a first post-Boolean operation shape (PBOS1) in some embodiments. In the single embodiment or in some embodiments, the operation comprises a logical conjunction (a Boolean AND operation) to create the first post-Boolean operation shape. At 312, the method or the system comprises the act or module of determining the level (LVL1) in the hierarchy of the shape (of the two shapes that created PBOS1) that is closest to the top of the hierarchy in the single embodiment or in some embodiments. More details about the act or module in 308 will be described in subsequent paragraphs with reference to FIGS. 9-14.

At 314, the method or the system further comprises the act or module of determining an inverse transform to transform the identified first shape (S1) to the previously determined level (LVL1). In the single embodiment or in some embodiments, the inverse transform is used to transform the identified first shape to the location it would have if its respective cellview master is placed at the origin. In the single embodiment or in some embodiments, the inverse transform is identified or determined but is not yet applied to the identified shape or any derivative shapes or geometries of the identified shape at 314.

At 316, the method or the system further comprises the act or module of determining the cellview master at the identified level (LVL1) of the instance path that the identified first shape (S1) is in according to the single embodiment or some embodiments. At 318, the method or the system further comprises the act or module of identifying or creating a master output layer (MOL) for the cellview master determined at 316. At 320, the method or the system further comprises the act or module of integrating the first post-Boolean operation (PBOS1) into another global scratch layer (GSL3) to create the first post-clipping shape (PCS1). In some embodiments, the act or module of integrating the PBOS1 into GSL3 comprises the respective act or module of clipping the PBOS1 against one or more existing shapes in GSL3 to reduce or remove duplication of shapes in the GSL3. That is, the method or the system subtract the area of the PBOS1 that overlaps with the one or more shapes that already exist in GSL3 in these embodiments to reduce or eliminate duplication. Note that the act or module of 320 may be optional in some embodiments where some duplication is permitted to exist.

At 322, the method or the system further optionally comprises the act or module of tessellating the PBOS1 (if 320 is not performed) or PCS1 (if 320 is performed) into a plurality of tiles in some embodiments. At 324, the method or the system further comprises the act or module of applying the previously determined inverse transform to the PBOS1 (if 320 and 322 are not performed), PCS1 (if 320 is performed, but 322 is not performed), or the plurality of tiles (if both 320 and 322 are performed) and then integrate the inversely transformed PBOS1, PCS1, or the plurality of tiles into the master output layer (MOL) of the hierarchical output.

At 326, the method or the system further comprises the act or module of determining whether or not there exist more first shapes for processing. In some embodiments where it is determined that there exist one or more first shapes to be processed, the method or the system loops back to 308 and repeats the acts of or repeatedly invokes the modules of 308-326 until all of the first shapes of interest are processed. In other embodiments where the method or the system determines that all of the first shapes of interest have been processed, the method or the system proceeds to 328 to continue.

Figure 9:
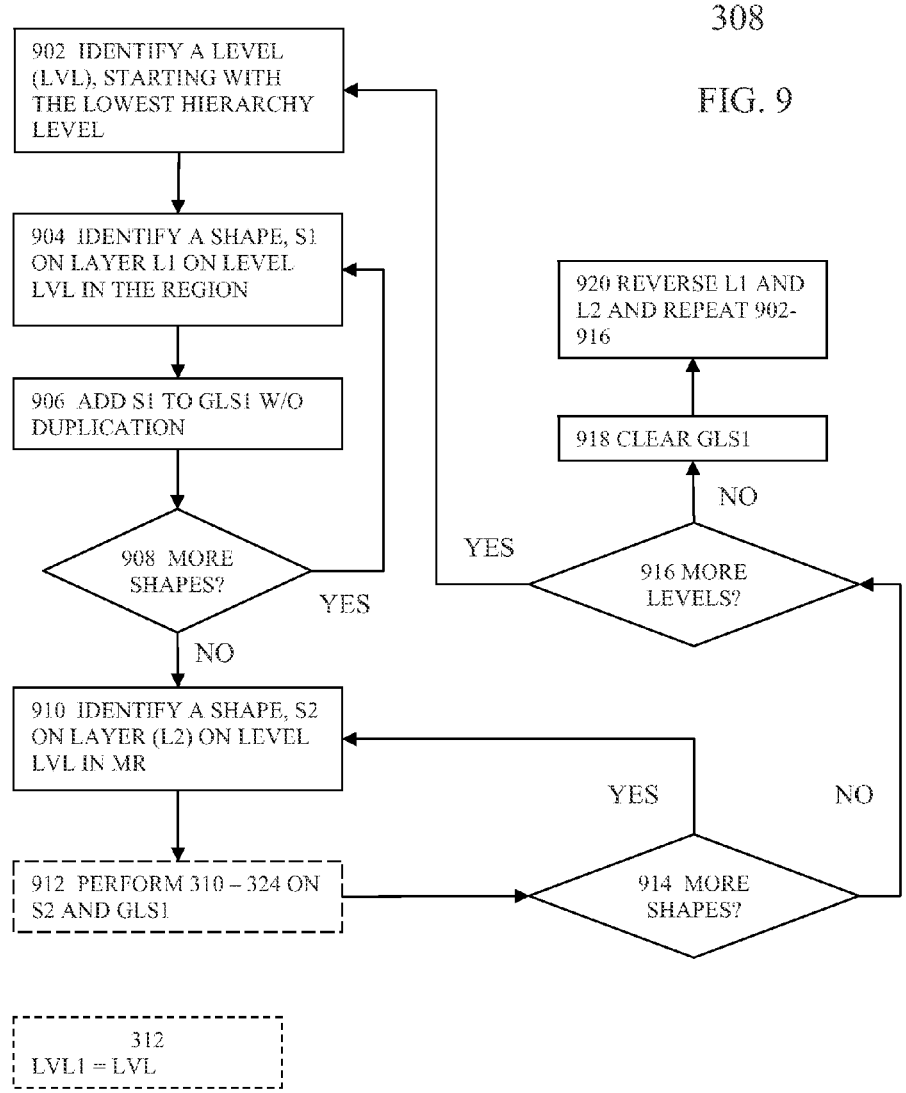
FIGS. 9-11 illustrate some exemplary and more detailed processes for identifying a first shape from a layer and a scratch layer of FIG. 3.

With reference to FIG. 9 which illustrates more details of the act or module of identifying a first shape from a layer and a GSL comprising one or more shapes of the other layer of FIG. 3 in some embodiments. In some embodiments, the act or module of 308 comprises the act or module of identifying a level (LVL) by starting from the lowest hierarchical level in the first or the second layer within the master region of the hierarchical electronic circuit design at 902. The act or module of 308 further comprises identifying the first shape (S1) on a layer (L1) which is one of the first and the second layer previously identified at 904. The act or module of 308 further comprises the act or module of integrating the first shape (S1) into GSL1 at 906. In some embodiments, the act or module of integrating S1 into GSL1 comprises clipping one or more overlapping areas between S1 and one or more existing shapes in GSL1 to reduce or remove duplication. In some embodiments, the act or module of integrating S1 comprises performing a logical disjunction (Boolean OR) between S1 and one or more existing shapes in GSL1.

At 908, the act or module of 308 comprises the act or module of determining whether there exist more first shapes to be integrated into GSL1. In some embodiments where the method or the system determines that there exist one or more first shapes to be integrated, the method or the system loops back to 904. Otherwise, the method or the system proceeds to 910 and further comprises the act or module of identifying a second shape (S2) on another layer (L2) on the level (LVL) in the master region.

At 912, the act or module of 308 comprises the act or module of performing the acts or invoking the modules of 310 through 324 whose details are illustrated in FIG. 3 and described in the preceding paragraphs. At 914, the act or module of 308 comprises the act or module of determining whether there exist one or more second shapes (S2) to be processed. In some embodiments where the method or the system determines that there exist one or more second shapes to be processed at 914, the method or the system loops back to 910. Otherwise, the method or the system proceeds to 916 to further comprise the act of or to invoke the module of determining whether there exist more levels to be processed in the master region.

In some embodiments where the method or the system determines that there exist more levels to be processed at 916, the method or the system loops back to 902 to identify another level in the hierarchy of the electronic circuit design in the master region. In some embodiments where the method or the system determines that all interesting levels have been processed, the method or the system proceeds to 918 to clear the contents of GSL1. The method or the system then proceeds to 920 to reverse L1 and L2 in the previous acts or modules of 902-916 and then repeats the acts of 902-916. More details of 920 will be described in subsequent paragraphs with reference to FIG. 12.

In these embodiments as illustrated in FIG. 9, the method or system further comprises the act or module of assigning LVL to LVL1 that is referenced in some acts or modules such as 312 of FIG. 3. That is, in these approaches, the method or the system assigns the value LVL to LVL1 that is referenced in 312. In other words, the method or the system needs not determine at which hierarchical level the generated shapes (PBOS, PCS, or tiles) are going to be created. Rather, the method or the system is already made aware of the hierarchical level (which is the "LVL") when it integrates PBOS, PCS, or tiles on the master output layer.

Figure 10:
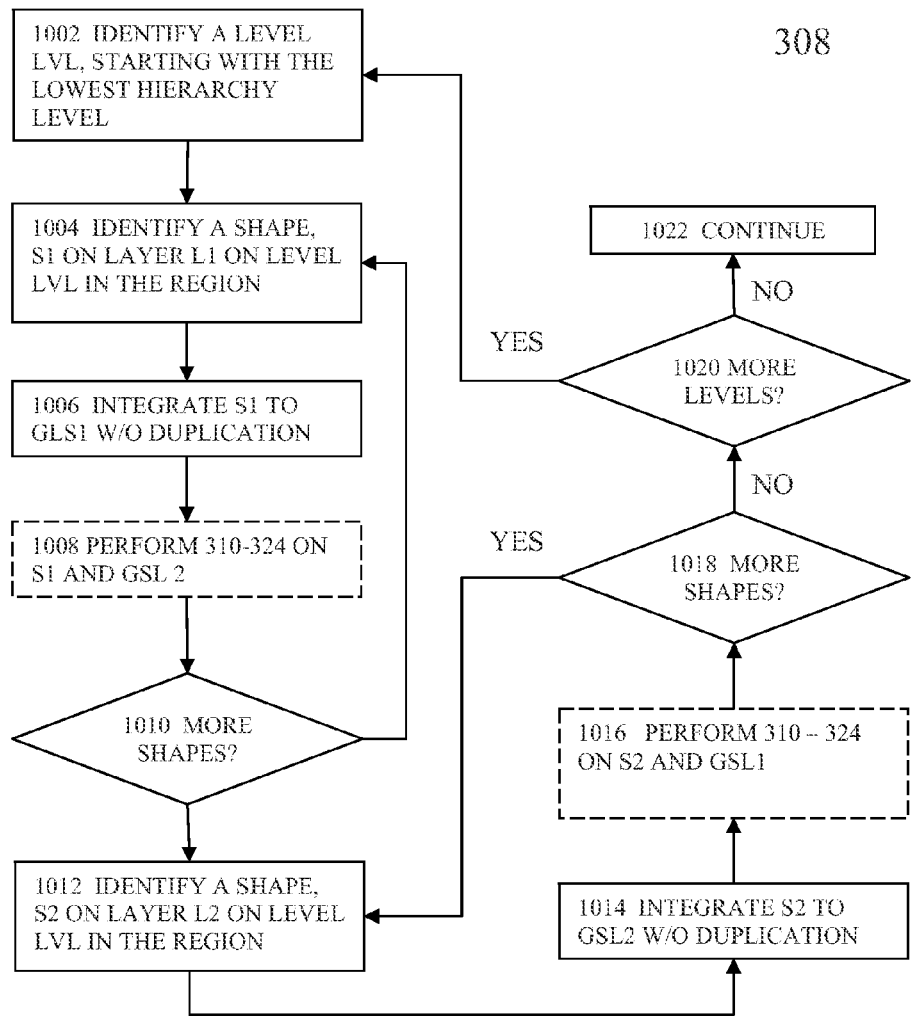

With reference to FIG. 10 which illustrates more details of the act or module of identifying a first shape from a layer and a GSL comprising one or more shapes of the other layer of FIG. 3 in some embodiments. In some embodiments, the act or module of 308 comprises the act or module of identifying a level (LVL) by starting from the lowest hierarchical level in the master region of the hierarchical electronic circuit design at 1002. The act or module of 308 further comprises identifying the first shape (S1) on a layer (L1), which is one of the first and the second layers previously identified, at 1004. The act or module of 308 further comprises the act or module of integrating the first shape (S1) into GSL1 at 1006. In some embodiments, the act or module of integrating S1 into GSL1 comprises clipping one or more overlapping areas between S1 and one or more existing shapes in GSL1 to reduce or remove duplication. In some embodiments, the act or module of integrating S1 comprises performing a logical disjunction (Boolean OR) between S1 and one or more existing shapes in GSL1.

At 1008, the act or module of 308 further comprises the act or module of performing the acts or invoking the modules of 310 through 324 for S1 and GSL2. That is, in these approaches, the method or the system references S1 identified at 1004 for the first shapes (S1) in 310-324 and GSL2 for the global scratch layers (GSL) that is referenced in 310-324. At 1010, the act or module of 308 comprises the act or module of determining whether there exist one or more first shapes (S1) to be processed. In some embodiments where the method or the system determines that there exist more shapes to be processed, the method or the system loops back to 1004 to identify the next S1 for processing. In some embodiments where the method or the system determines that all the interesting first shapes (S1) have been processed, the method or the system proceeds to 1012 to identify a second shape (S2) on a second layer (L2) at the hierarchical level (LVL) in the master region.

At 1014, the act or module of 308 comprises the act or module of integrating the second shape (S2) into GSL2. In some embodiments, the act or module of integrating S2 into GSL2 comprises clipping one or more overlapping areas between S2 and one or more existing shapes in GSL2 to reduce or remove duplication. In some embodiments, the act or module of integrating S2 comprises performing a logical disjunction (Boolean OR) between S2 and one or more existing shapes in GSL2.

At 1016, the act or module of 308 comprises the act or module of performing the acts of or invoking the modules of 310 through 324 on S2 and GSL1. That is, the method or the system refers to S2 in place of the first shape (S1) referenced in the acts or modules of 310-324 and refers to GSL1 in place of the global scratch layer (GSL) referenced in the acts or modules of 310-324 in these embodiments.

At 1018, the act or module of 308 comprises the act or module of determining whether or not there exist more second shapes (S2) to be processed. In some embodiments where the method or the system determines that there exist one or more second shapes to be processed, the method or the system loops to 1012 to identify the next second shape (S2) and repeats the acts or modules of 1012-1016. In some embodiments where it is determined that all the interesting second shapes have been processed, the method or the system proceeds to 1020 to determine whether or not there exist one or more interested hierarchical levels in the master region to be considered. The system or the method loops back to 1002 to identify another hierarchical level and repeats the acts or modules of 1002-1020 if there exist one or more hierarchical levels to be processed, or the method or the system proceeds to 1022 to continue.

In these embodiments as illustrated in FIG. 10, the method or system further comprises the act or module of assigning LVL to LVL1 that is referenced in some acts or modules such as 312 of FIG. 3. That is, in these approaches, the method or the system assigns the value LVL to LVL1 that is referenced in 312. In other words, the method or the system needs not determine at which hierarchical level the generated shapes (PBOS, PCS, or tiles) are going to be created. Rather, the method or the system is already made aware of the hierarchical level (which is the "LVL") when it integrates PBOS, PCS, or tiles into the master output layer.

Figure 11:
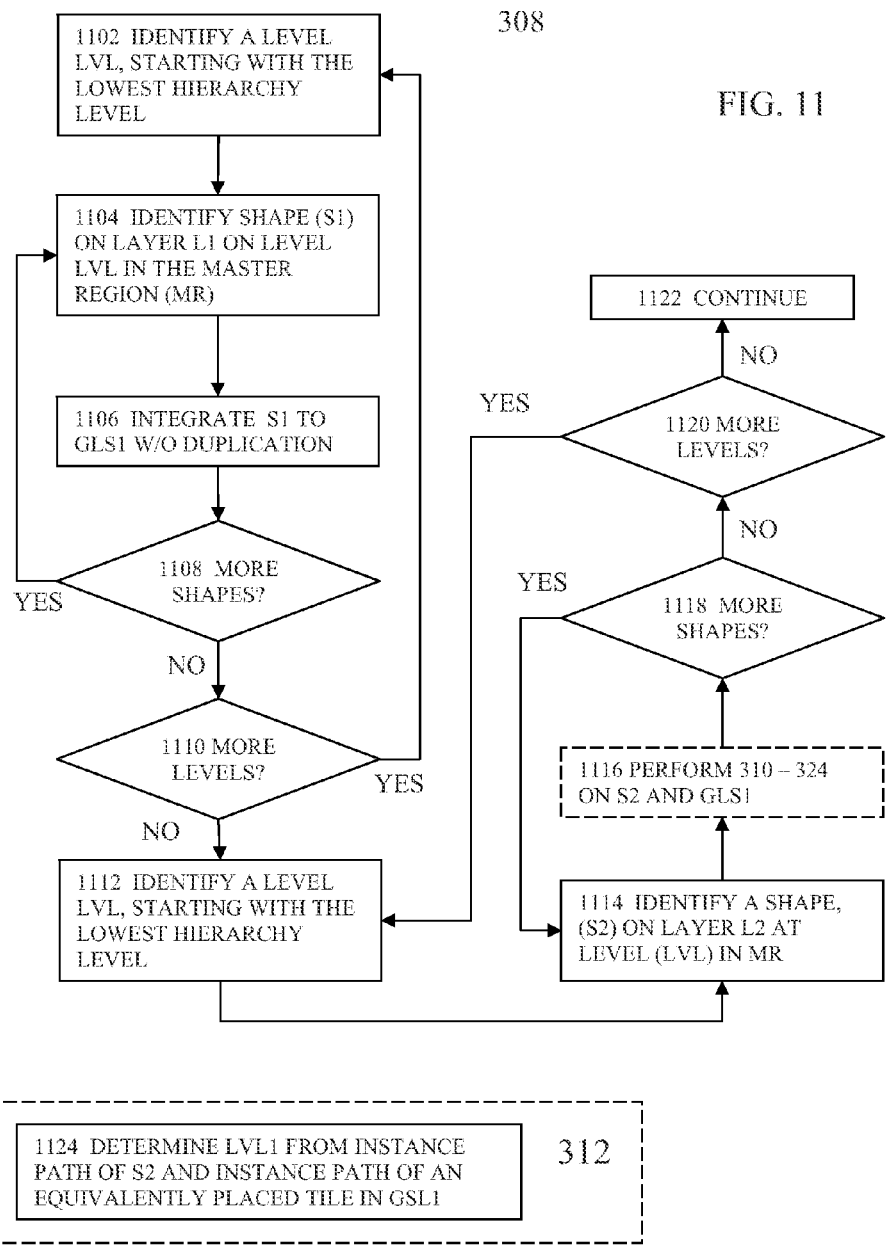

With reference to FIG. 11 which illustrates more details of the act or module of identifying a first shape from a layer and a GSL comprising one or more shapes of the other layer of FIG. 3 in some embodiments. In these embodiments, the act or module of 308 comprises the act or module of identifying a level (LVL) by starting from the lowest hierarchical level in the master region of the hierarchical electronic circuit design at 1102. The act or module of 308 further comprises the act or module of identifying the first shape (S1) on a layer (L1), which is one of the first and the second layer previously identified, at 1104. The act or module of 308 further comprises the act or module of integrating the first shape (S1) to GSL1 at 1106. In some embodiments, the act or module of integrating S1 into GSL1 comprises clipping one or more overlapping areas between S1 and one or more existing shapes in GSL1 to reduce or remove duplication. In some embodiments, the act or module of integrating S1 comprises performing a logical disjunction (Boolean OR) between S1 and one or more existing shapes in GSL1.

The act or module of 308 further comprises the act or module of determining whether there exist one or more first shapes (S1) to be processed at 1108. In some embodiments where the method or the system determines that there exist more shapes to be processed, the method or the system loops back to 1104 to identify the next S1 for processing. In some embodiments where the method or the system determines that all the interesting first shapes (S1) have been processed, the method or the system proceeds to 1110 to determine whether there exist one or more hierarchical levels to be processed. In some embodiments where the method or the system determines that there exist one or more hierarchical levels to be processed, the method or the system loops back to 1102. In some embodiments where the method or the system determines all the interesting levels in the master region have been processed, the method or the system proceeds to 1112 at which the act or module of 308 comprises the act or module of identifying a level (LVL) by starting from the lowest hierarchical level in the master region of the hierarchical electronic circuit design at 1002. The method or system then proceeds to 1114 at which the act or module 308 comprises identifying a second shape (S2) on a second layer (L2) at the hierarchical level (LVL) in the master region.

At 1116, the act or module of 308 further comprises the act or module of performing the acts of or invoking the modules of 310 through 324 on the second shape (S2) and the first global scratch layer (GSL1). That is, the method or the system refers to S2 in place of the first shape (S1) referenced in the acts or modules of 310-324 and refers to GSL1 in place of the global scratch layer (GSL) referenced in the acts or modules of 310-324 in these embodiments.

At 1118, the method or the system further comprises the act or module of determining whether or not there exists one or more second shapes (S2) to be processed. In some embodiments where the method or the system determines that there exist more second shapes to be processed, the method or the system loops back to 1114. In some embodiments where the method or the system determines that all of the interesting second shapes (S2) have been processed, the method proceeds to 1120. At 1120, the act or module 308 further comprises the act or module of determining whether there exists one or more levels to be processed. In some embodiments where the method or the system determines that there exist more levels to be processed, the method or the system loops back to 1112. In some embodiments where the method or the system determines that all of the interesting levels have been processed, the method proceeds to 1122 to continue.

In these embodiments as illustrated in FIG. 11, the act or module 312 further comprises the act or module of determining the level (LVL1) from the instance path of the second shape (S2) and the instance path of an equivalently placed tile in the first global scratch layer (GSL1) (1124). In some embodiments, the method or the system determines the level (LVL1) by examining the hierarchical level at which the second shape (S2) is located the hierarchical level of the one or more shape(s) in GSL1 that are used in creating the second post-Boolean operation shape (PBOS2) based at least in part upon the instance paths of S2 and the one or more shapes in GSL1. In some embodiments, the method or the system determines the level (LVL) at which the hierarchical output is to be populated by identifying the higher hierarchical level of S2 and that of the one or more paths in GSL1.

Figure 12:
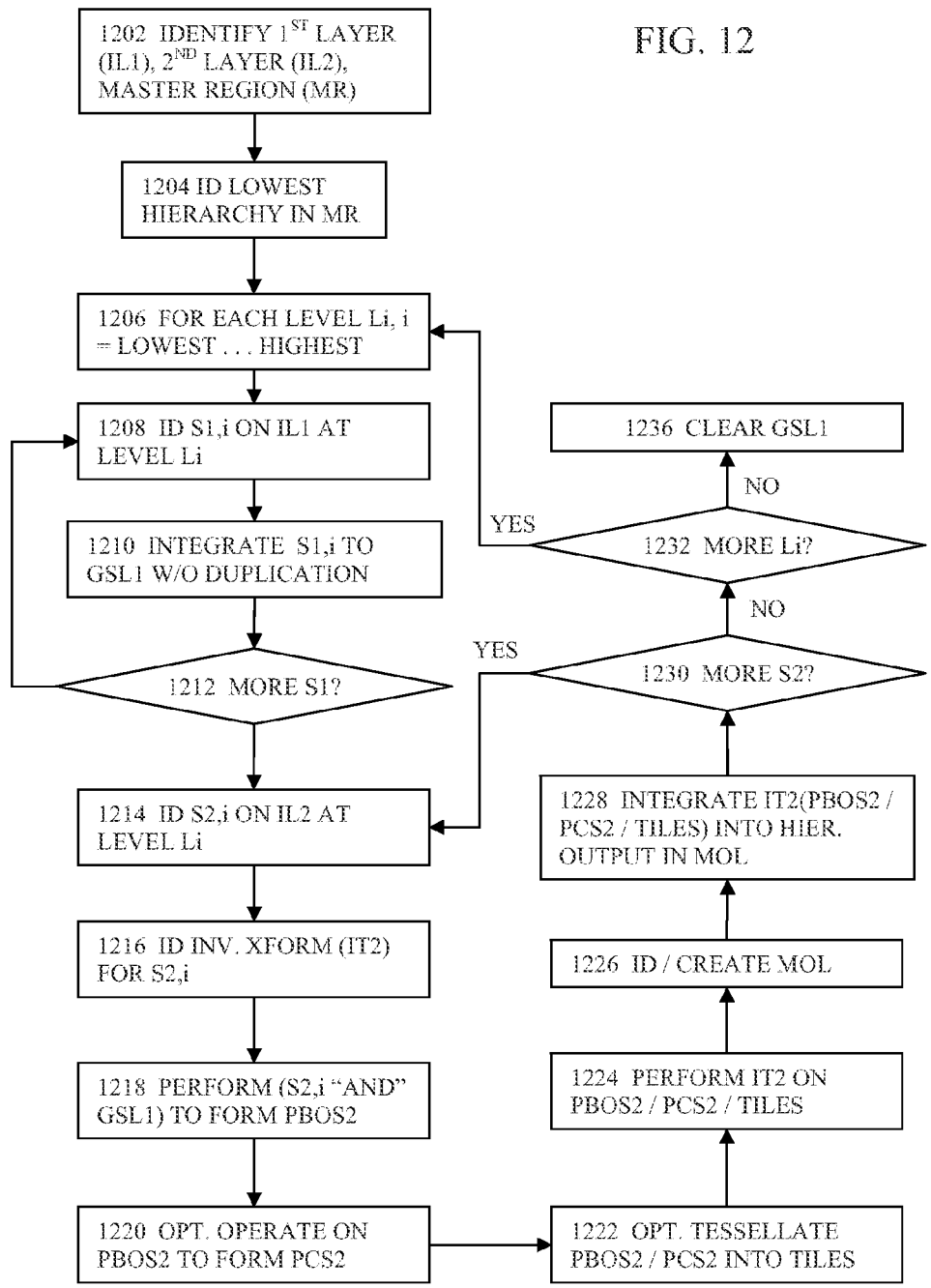
Figure 12:
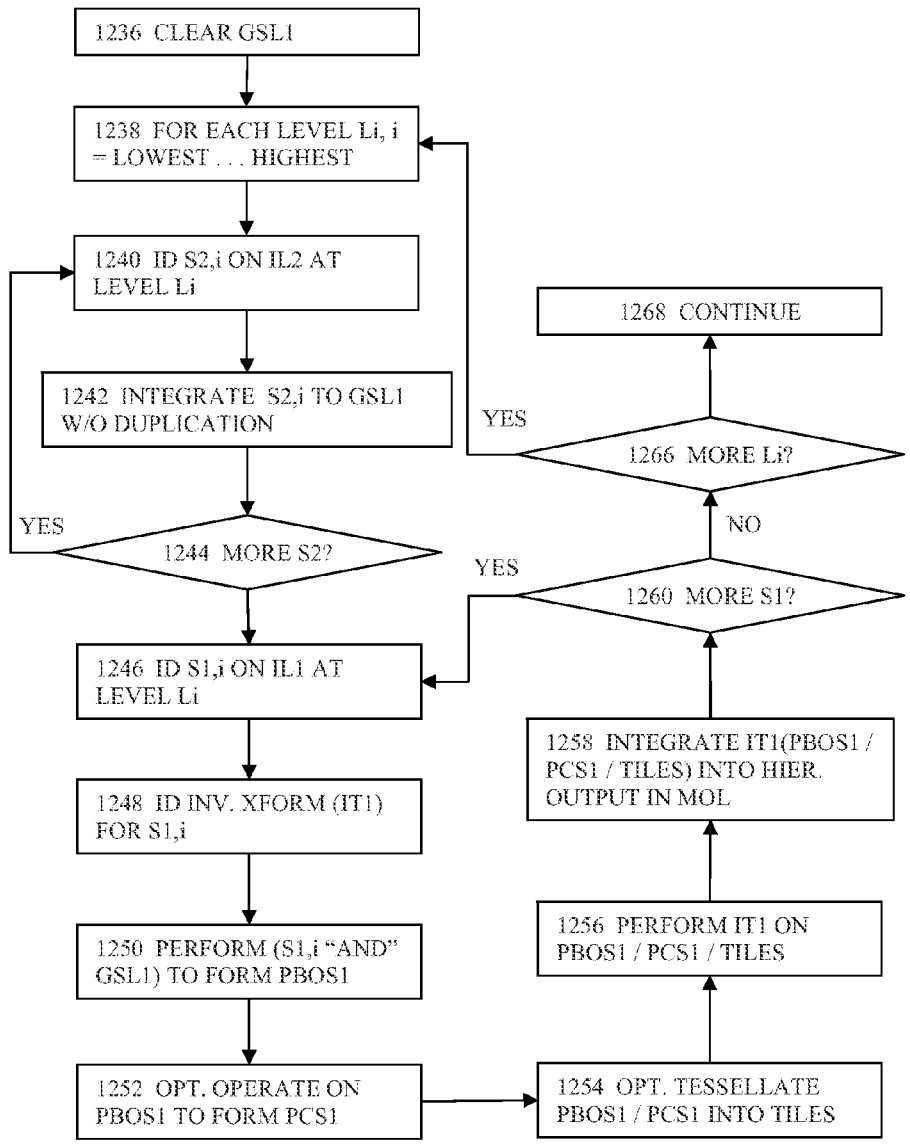

With reference to FIG. 12 which illustrates an example of the approach as illustrated in FIG. 9 in some embodiments, the method or the system comprises the act or module of identifying the first layer (IL1), the second layer (IL2), and the master region (MR) at 1202 and identifying the lowest hierarchical level in the master region at 1204. At 1206, the method or the system comprises the act or module of iterating through each of the interesting hierarchical levels from the lowest to the highest hierarchical level in the master region. For each of the interesting hierarchical levels (Li) identified at 1206, the method or the system comprises the act or module of identifying a first shape S1,i at the level Li at 1208. The method or the system comprises the act or module of integrating S1,i into the first global scratch layer (GSL1) at 1210. In some embodiments, method or the system comprises the act or module of reducing or removing duplication while integrating S1,i into GSI1 with or without performing the logical disjunction as described in the preceding paragraphs. In some embodiments, the act of integrating the first shapes into the first global scratch layer comprises the act or module of adding a subsequent first shape to the global scratch layer and clipping the subsequent first shape against one or more previously integrated first shapes that already exist in the first global scratch layer to reduce or remove duplication. In some embodiments, the act of integrating the first shapes comprises the act of performing a logical disjunction between a first shape and one or more previously integrated first shapes that already exist in the first global scratch layer.

At 1212, the method or the system comprises the act or module of determining whether there exist more first shapes to be processed. In some embodiments where it is determined that there are more first shapes to be processed at the level Li, the method or the system loops back to 1208 to identify the next first shape. In some embodiments where it is determined that all the interesting first shapes have been integrated into the first global scratch layer, the method or the system proceeds to 1214. At 1214, the method or the system comprises the act or module of identifying the second shape on the second layer (IL2) at the Level Li (S2,i). At 1216, the method or the system comprises the act or module of identifying an inverse transform (IT2) for the second shape (S2,i). At 1218, the method or the system comprises the act or module of performing the logical conjunction (Boolean AND) between S2,i and one or more shapes in GSL1 to create or form the second post-Boolean operation shape (PBOS2). The details of performing the logical conjunction between a shape and one or more shapes in a global scratch layer are described in the preceding paragraphs and also in the examples in the subsequent paragraphs with reference to various figures.

At 1220, the method or the system optionally comprises the act or module of operating on the PBOS2 to form the second post-clipping shape (PCS2) in some embodiments. The details of operating on a post-Boolean operation shape to create or form a post-clipping shape are described in the previous paragraphs with reference to FIGS. 3 and 9-11 and also in the examples in the subsequent paragraphs with reference to various other figures. At 1222, the method or the system optionally comprises the act or module of tessellating the PBOS2 (if 1220 is not performed) or the PCS2 (if 1220 is performed) into a plurality of tiles in some embodiments. At 1224, the method or the system optionally comprises the act or module of applying the inverse transform (IT2) on the PBOS2, PCS2, or the plurality of tiles depending on whether or not each of 1220 and 1222 is performed.

At 1226, the method or the system optionally comprises the act or module of identifying a master output layer (MOL). The method or the system may also comprise the act or module of creating the MOL if it does not exist yet. At 1228, the method or the system optionally comprises the act or module of integrating the PBOS2, PCS2, or the plurality of tiles into the hierarchical output, in the master output layer for the corresponding cellview master. In some embodiments, the method or the system reduces or removes duplication when integrating the PBOS2, PCS2, or the tiles into the MOL. More details about reducing or removing duplication are described in the preceding paragraphs.

At 1230, the method or the system optionally comprises the act or module of determining whether there exists one or more interesting second shapes at the current level Li to be processed. If there exists one or more interesting second shapes to be processed, the method or system loops back to 1214 in some embodiments. In some embodiments, the method or the system proceeds to 1232 if it is determined that all the interesting second shapes (S2,i) have been processed. At 1232, the method or the system determines whether there are more levels (Li) to be processed and then proceeds to 1206 to identify the next interesting hierarchical level (Li) in some embodiments or 1236 in some other embodiments. At 1236, the method or the system comprises the act or module of clearing the contents of GSL1 which comprises the results of the acts or modules of 1208-1210.

The acts or the modules of 1238-1268 continue from 1236 and illustrate an example of reversing the two input layers in FIG. 9. At 1238, the method or the system optionally comprises the act or module of iterating through each of the hierarchical levels (Li) from the lowest to the highest hierarchical level. In some embodiments, the method or the system comprises the act or module of identifying one or more shapes S2,i on the second input layer (IL2) at the level Li at 1240 and integrating S2,i into GSL1 at 1242 by using a similar process or algorithm as that of 1210. At 1244, the method or the system comprises the act or module of determining whether there are more second shapes to be processed. In some embodiments, the method or system loops back to 1240 if it is determined that there exist more second shapes to be integrated into the global scratch layer. In some embodiments where it is determined that all the interesting second shapes have been integrated, the method or the system proceeds to 1246. The method or the system comprises the acts or modules of identifying a first shape, S1,i, on the first input layer (IL1) at the current level Li at 1246 and identifying an inverse transform (IT1) for the first shape S1,i at 1248 to transform the first shape to the location it would have if the cellview master of the first shape is placed at the origin.

At 1250, the method or the system comprises the act or module of performing a logical conjunction between S1,i and one or more shapes in GSL1 to create the first post-Boolean operation shape PBOS1. At 1252, the method or the system optionally comprises the act or module of operating on the PBOS1 to form the first post-clipping shape PCS1 by using a similar process or algorithm as that of 1220. At 1254, the method or the system may further optionally comprise the act or module of tessellating the PBOS1 or PCS1 into a plurality of tiles by using a similar process or algorithm as that of 1222.

At 1256, the method or the system comprises the act or module of applying the inverse transform (IT1) to the PBOS1, PCS1, or the plurality of tiles depending upon whether each of 1252 and 1254 is performed in some embodiments. At 1258, the method or the system comprises the act or module of integrating the PBOS1, PCS1, or the plurality of tiles that have been inversely transformed at 1256 into the hierarchical output in the master output layer (MOL) for the cellview master to which the first shape belongs. At 1260, the method or the system comprises the act or module of determining whether there exist one or more first shapes (S1) for processing and proceeds to 1246 or 1266 accordingly. At 1266, the method or the system comprises the act or module of determining whether there exist one or more levels (Li) to be processed and proceeds to 1238 and 1268 accordingly.

Figure 13:
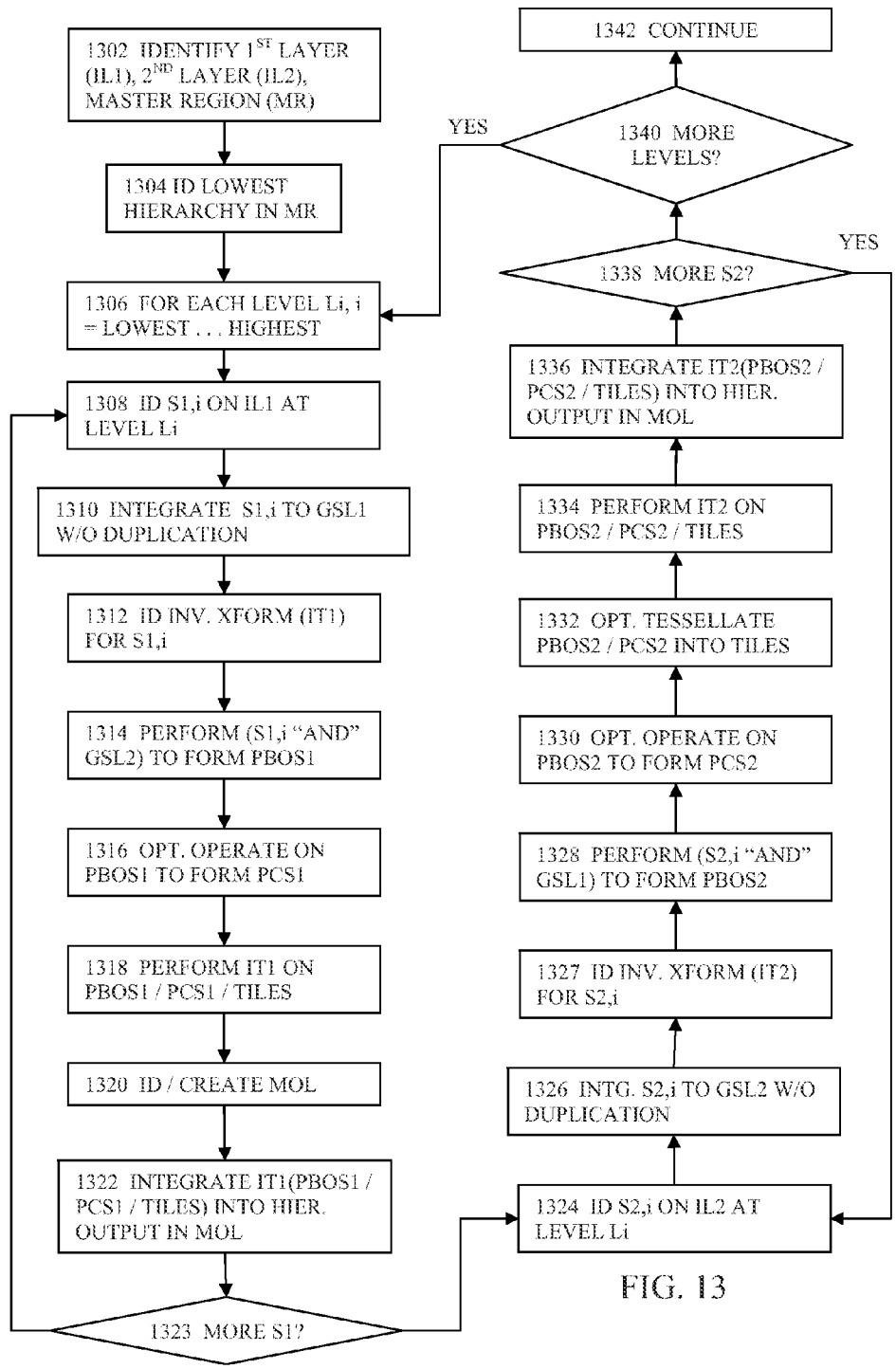

With reference to FIG. 13 which illustrates an example of the approach as illustrated in FIG. 10 in some embodiments, the method or the system comprises the acts of identifying the first layer (IL1), the second layer (IL2), and the master region (MR) at 1302 and identifying the lowest hierarchical level in the master region at 1304 in these embodiments. The method or the system further comprises the act or module of iterating through the interested levels (Li) from the lowest level to the highest hierarchical level in the master region at 1306. The method or the system further comprises the acts or modules of identifying a first shape (S1,i) on the first input layer (IL1) at level Li at 1308 and integrating S1,i into the first global scratch level GSL1 while reducing or removing duplication at 1310.

The method or the system further comprises the acts or modules of identifying an inverse transform (IT1) for S1,i at 1312 and performing a logical conjunction between S1,i and one or more shapes in GSL2 to create the first post-Boolean operation shape PBOS1 at 1314 in some embodiments. The method or the system further optionally comprises the acts or modules of operating on the PBOS1 to create the first post-clipping shape (PCS1) and tessellating the PBOS1 or PCS1 into a plurality of tiles at 1316. The method or the system further comprises the act or module of applying the inverse transform (IT1) to PBOS1, PCS1, or the plurality of tiles at 1318 depending upon whether or not 1316 is performed.

The method or the system further comprises the act or module of identifying or creating a master output layer (MOL) for the cellview master of the shape S1,i at 1320. The method or the system further comprises the act or module of integrating the inversely transformed PBOS1, PCS1, or tiles into the hierarchical output in the MOL with or without duplication at 1322 and determining whether there exist one or more first shapes to be processed at 1323. In some embodiments where the methods or the system determines that there exist more first shapes to be processed, the method or system loops back to 1308 to identify the next first shape at the level Li. In some embodiments where it is determined that all the interesting first shapes have been processed, the method or system proceeds to 1324. At 1324, the method or the system further comprises the act or module of identifying a second shape S2,i at the current level L1 on the layer IL2.

The method or the system further comprises the act or module of integrating S2,i in to GSL2 while reducing or removing duplication at 1326 and identifying an inverse transform (IT2) for the second shape at 1327 in some embodiments to transform the second shape to the location it would have if its corresponding cellview master is placed at the origin. At 1328, the method or the system further comprises the act or module of performing a logical conjunction between S2,i and one or more shapes in GSL1 to create the second post-Boolean operation PBOS2. The method or the system further optionally comprises the acts or modules of operating on PBOS2 to create PCS2 at 1330 and tessellating PBOS2 or PCS2 into a plurality of tiles at 1332 in some embodiments.

The method or the system further comprises the act or module of applying the inverse transform (IT2) to PBOS2, PCS2, or the plurality of tiles at 1334 and integrating the inversely transformed PBOS2, PCS2, or the tiles into the hierarchical output in the MOL for the cellview master with or without duplication at 1336. At 1338, the method or the system further comprises the act or module of determining whether there exists one or more second shapes (S2,i) to be processed and proceeds to 1340 and 1324 accordingly in some embodiments. At 1340, the method or the system further comprises the act or module of determining whether there exist one or more levels that need to be processed and proceeds to 1306 to identify another level and repeat 1306-1340 and to 1342 accordingly in some embodiments.

With reference to FIG. 14 which illustrates an example of the approach as illustrated in FIG. 11 in some embodiments, the method or the system comprises the acts of identifying the first layer (IL1), the second layer (IL2), and a master region (MR) at 1402 and identifying the lowest hierarchical level in the master region at 1404 in these embodiments. The method or the system further comprises the act or module of iterating through the interesting levels (Li) from the lowest level to the highest hierarchical level in the master region at 1406.

The method or the system further comprises the acts or modules of identifying a first shape (S1,i) on the first layer at the current level Li at 1408 and integrating the first shape into the first global scratch layer (GSL1) while reducing or removing duplication at 1410. The method or the system may also designate or mark the first shape as level Li for further processing at 1410 in some embodiments. The method or the system further comprises the act or module of, determining whether there exists one or more first shapes to be processed at 1412 and proceeds to 1408 or 1413 accordingly in some embodiments. At 1413, the method or the system further comprises the act or module of determining whether there exists one or more levels to be processed. In some embodiments where it is determined that there exist additional level(s) to be processed, the method or the system loops back to 1406 to identify another level for processing. In some embodiments where all the interesting levels have been processed, the method or the system proceeds to 1414. The method or the system further comprises the acts or modules of iterating through all the interested levels (Lj) from the lowest to the highest hierarchical level in the master region at 1414 and identifying a second shape (S2,j) on the second layer (IL2) at the level Lj at 1416.

At 1418, the method or the system further comprises the act or module of performing a logical conjunction between S2,j and one or more shapes in the first global scratch layer (GSL1) to create the second post-Boolean operation shape (PBOS2). The method or the system further optionally comprises the acts or modules of operating on the PBOS2 to form the second post-clipping shape (PCS2) at 1420 and tessellating PBOS2 or PCS2 into tiles at 1426. The method or the system further comprises the acts or modules of determining the level (LEVEL1) for a shape in GSL1 that is used to form PBOS2 at 1422 and determining another level (LEVEL2) based at least in part upon LEVEL1 and the level Lj in order to place the transformed PBOS2 or PCS2 at 1424. In some embodiments, the method or the system selects the higher hierarchical level of LEVEL1 and level Lj as LEVEL2 at which the transformed PBOS2 or PCS2 (or corresponding tiles) will be placed.

The method or the system further comprises the act or module of determining an inverse transform (IT2) that would transform the second shape S2,j to LEVEL2 at 1428. At 1430, the method or the system further comprises the act or module of applying the inverse transform (IT2) to the PBOS2, PCS2, or the corresponding tiles depending upon whether each of the optional acts or modules 1420 and 1426 is performed. At 1432, the method or the system further comprises the acts or modules of identifying or creating a master output layer for the corresponding cellview master and integrating the inversely transformed PBOS2, PCS2, or its corresponding tiles into the hierarchical output in the master output layer at 1434.

At 1436, the method or the system further comprises the act or module of determining whether there exists one or more second shapes (S2,j) to be processed and proceeds to 1416 and 1438 accordingly in some embodiments. At 1438, the method or the system further comprises the act or module of determining whether there exists one or more levels (Lj) to be processed or examined and proceeds to 1440 to continue with other processes or to 1414 to identify another level (Lj) for repeatedly performing 1416 through 1440 accordingly in some embodiments.

Figure 4:
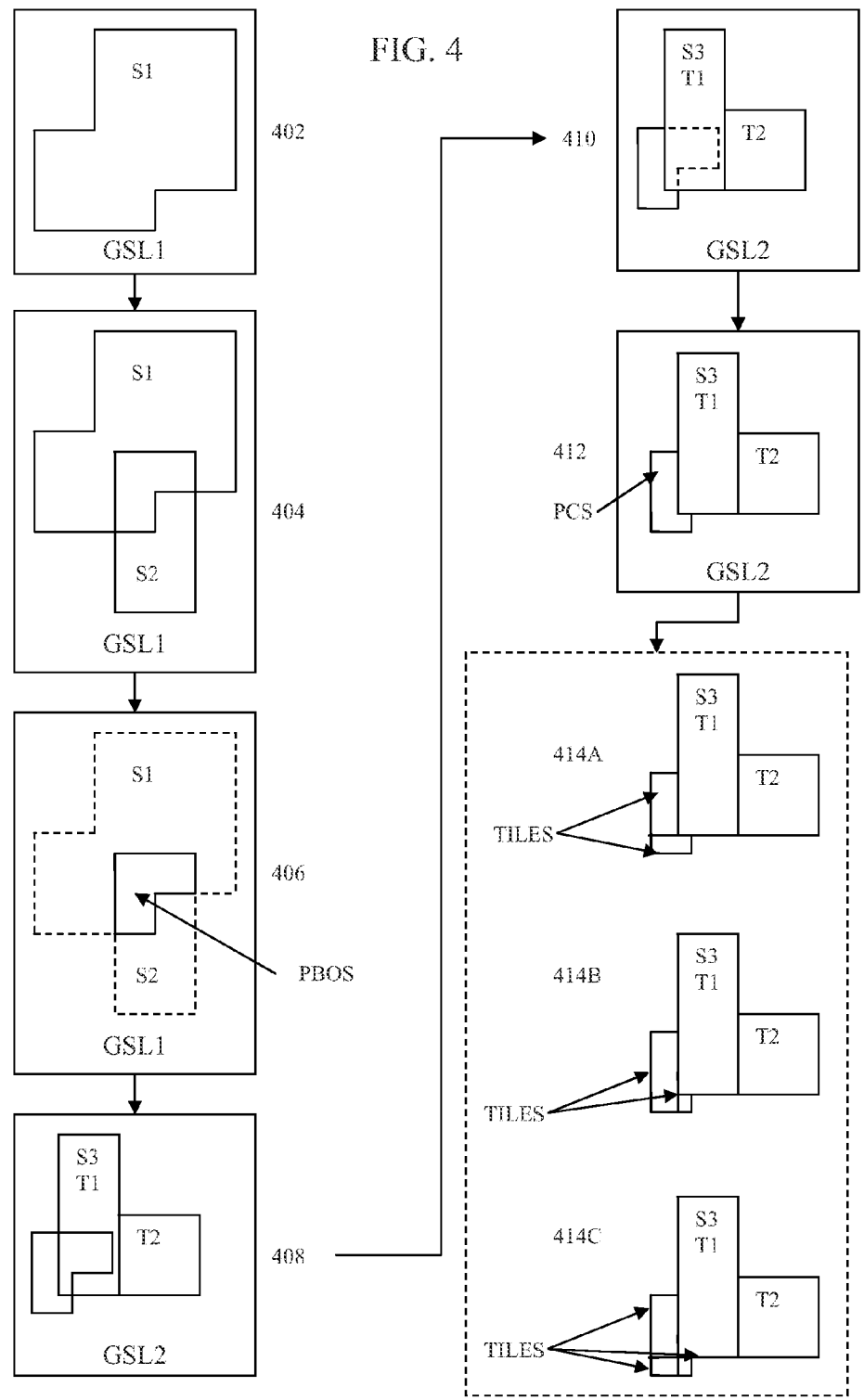
FIG. 4 illustrates an example of the operations of the methods or the systems as described with reference to FIGS. 2-3.

Referring to FIG. 4 which illustrates an example of the operations of the methods or the systems as described with reference to FIGS. 2-3. 402 represents the first global scratch layer (GSL1) which is already populated with one or more shapes (S1) on a first layer of the electronic circuit design. For example, the shape S1 in GSL1 may be obtained by performing a logical OR operation or a logical disjunction operation upon two or more rectangular shapes on the first layer. 404 depicts the process of performing a logical conjunction between a shape (S2) on a second layer of the electronic circuit design and one or more shapes in the first global scratch layer (GSL1).

406 depicts the resultant shape or the post-Boolean operation shape (PBOS), which is represented by the polygonal regions in solid lines, between S1 and S2 in GSL1. The dashed lines in 406 represent the original boundaries of S1 and S2. At 408, the post-Boolean operation shape (PBOS) is added to the second scratch layer (GSL2) in which shape S3 has already existed at the time shape S2 is to be added to GSL2. In some embodiments, only the portion of the post-Boolean operation shape (PBOS) that is unique will be added to the second global scratch layer, that is only the portion not present in the second global scratch layer will be added. In some embodiments, GSL2 represents the shapes of a logical conjunction (Boolean AND) operation that is performed or is to be performed on the first and the second layer of the electronic circuit design. In this example, shape S3 has been tessellated into two tiles T1 and T2 as shown in 408.

At 410, the methods or the systems of some embodiments of the invention perform a clipping process that removes the overlapping area between the PBOS and the pre-existing shape S3 to avoid duplication. At 412, the post-Boolean operation shape (PBOS) is clipped against the existing shape S3 and results in a post-clipping shape (PCS). 414A-C illustrate some possible tessellation processes or modules for the post-clipping shape (PCS) which tessellate the PCS vertically, horizontally, or both to form a plurality of tiles. As presented above in the preceding paragraphs, other tessellation processes or modules may also be used and are not limited to produce rectangular tiles. The methods or the system then apply the inverse transform to the tiles so as to create a hierarchical output for a Boolean operation which is or is to be operated upon an electronic design for the performance of a task on the electronic circuit.

Figure 5:
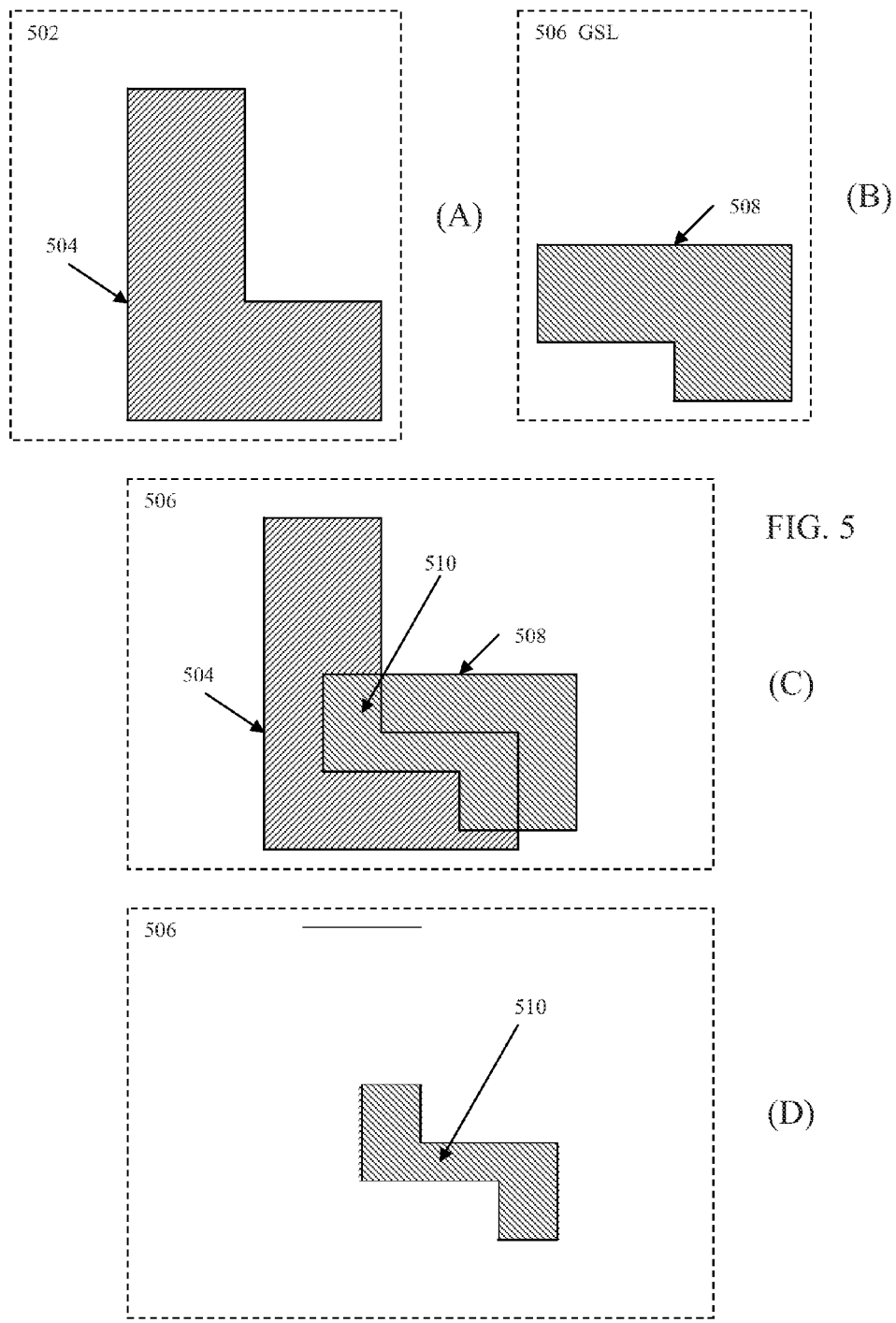
FIG. 5 illustrates an application of the method or the system in some embodiments as described with reference to FIGS. 2-4.

FIG. 5 illustrates an application of the method or the system in some embodiments as described with reference to FIGS. 2-4. More particularly, FIG. 5 illustrates the exemplary application of the method or the system described herein for a process hotspot detection. Similarly, as a result of a manufacturing process, any regions in the electronic circuit design which may not be reliably corrected with existing methods or subsequent manufacturing processes may be referred to as process hotspots.

At 502, the method or the system for generating a hierarchical output for an operation identifies a shape 504 as illustrated in FIG. 5(A). In this example, the identified shape 504 may represent the shape(s) corresponding to one or more possible hot spots in the electronic circuit design. In some embodiments, the identified shape 504 may represent an augmented shape corresponding to one or more possible process hot spots in the electronic circuit design with respect to a particular semiconductor fabrication process. For example, the identified shape 504 may represent the one or more shapes augmented by a lithographic halo (for example, a lithographic halo of 1.0 microns) where the one or more shapes correspond to one or more possible process hot spots in the electronic circuit design with respect to a particular semiconductor fabrication process.

FIG. 5(B) illustrates the global scratch layer 506 which comprises an existing shape 508. In some embodiments, the existing shape 508 corresponds to one or more polygons on a target layer which represent the one or more polygons that are desired to be printed. In (C), the method or the system for generating a hierarchical output for an operation adds shape 504 to the global scratch layer 506. The area 510 represents the overlapped area between the shape 504 and the existing shape 508.

In (D), the method or the system for generating a hierarchical output for an operation performs an operation between the shape 504 and the existing shape 508 to obtain the post operation shape instance 510 which represents both an area that will be printed during the fabrication of the electronic circuit design and a possible process hot spots. In this manner, the method or the system for generating a hierarchical output for an operation (a Boolean AND operation or a logical conjunction in this example) determines the one or more potential process hot spots within the area of interest by determining whether the polygons to be manufactured or printed during fabrication may potentially fall within certain process hot spots with respect to a particular fabrication process.

In FIG. 5(E), the method or the system for generating a hierarchical output for an operation may optionally tessellate the post operation shape 510 into tiles in some embodiments. The method or the system for generating a hierarchical output for an operation then performs the inverse transform on the tiles to determine their locations that the tiles would have if they are placed in the electronic circuit design. FIG. 5(E) shows that the post operation shape 510 is tessellated into five tiles. Nonetheless, the method or the system may tessellate the post operation shape 510 into other combinations of tiles of various shapes including triangular or other polygonal tiles.

In some other embodiments, the method or the system for generating a hierarchical output for an operation does not tessellate the post operation shape 510. The method or the system for generating a hierarchical output for an operation then performs the inverse transform directly on the post operation shape 510. FIG. 5(F) shows that the method or the system for generating a hierarchical output for an operation adds the post operation shape 510 or the resulting tessellated tiles to the master output layer for the hierarchical output. The hatched rectangular shape 514 represents an existing shape that already exists in the master output layer 512. In this particular example as illustrated in FIG. 5, the existing shape 514 represents a previously determined potential process hot spot.

FIG. 5(G) illustrates that the method or the system for generating a hierarchical output for an operation integrates the post operation shape 510 or the resulting tiles into the existing shape 514. In this example as illustrated in FIG. 5(G), the method or the system for generating a hierarchical output for an operation clips the post operation shape 510 or the resulting tiles against the existing shape 514 to remove or avoid any duplication. That is, the method or the system for generating a hierarchical output for an operation deletes the overlapped area between shape 514 and shape 510 such that no shapes, which represent a potential process hot spot, in the master output layer 512 will be represented by more than one cell.

In the single embodiment or in some embodiments, the methods or the systems parallel the act for performing one or more tasks, such as one or more dummy fill insertion tasks and/or one or more design rule checking tasks, in a multi-threading system using the hierarchical output for a Boolean operation which is or is to be operated upon an electronic design for the performance of a task on the electronic circuit. Due to variations in thread granularity and the usually slower frequencies and/or additional pipeline stages that are necessary to accommodate thread-switching architecture, the methods or the systems may group the total threads into one or more groups of thread subsets, each of which may then be load-balanced independently in the single embodiment or in some embodiments. The methods or the systems may further establish a load-balancing policy for each thread subset based at least in part upon the characteristics of the thread subset and the task(s) sent to the threads within the subset.

In these embodiments, the methods or the systems divide the master region of the hierarchical electronic circuit into a plurality of uniform or non-uniform portions or regions and distribute at least one of the plurality of portions or regions of the electronic circuit design to a thread of a processor. Any manner of dividing the hierarchical design can be utilized to divide the design. In some embodiments, the methods or the systems divide the master region of the electronic circuit design into a plurality of uniform or non-uniform portions or regions according to one or more routing directions in the master region of the electronic circuit design.

For example, in a first sub-region of the master region where the routing direction is running vertically, the methods or the systems may then divide the master region vertically to create a vertical slice or sub-region for the first sub-region. If the routing direction of a second sub-region adjacent to the first sub-region is running horizontally, the methods or the systems may then divide the master region to create a horizontal sub-region for the second sub-region.

In some embodiments, the methods or the systems divide the master region or the design area of the electronic circuit design. For example, the methods or the systems may simply divide the design area or the master region into uniform or non-uniform horizontal or vertical slices by the number of available threads. In some embodiments, the methods or the systems may divide the design area into uniform or non-uniform grids with horizontal and vertical sub-regions. In some embodiments, the methods or the systems divide the design area under consideration without taking into account the block boundaries, gates, or functionality of any sub-regions or components because the methods or the systems produce or have the capability to produce the shapes of one or more Boolean operations at any given level or levels of the hierarchy of the master region of the electronic circuit design even if the division crosses the boundaries of a subcell.

Figure 7A:
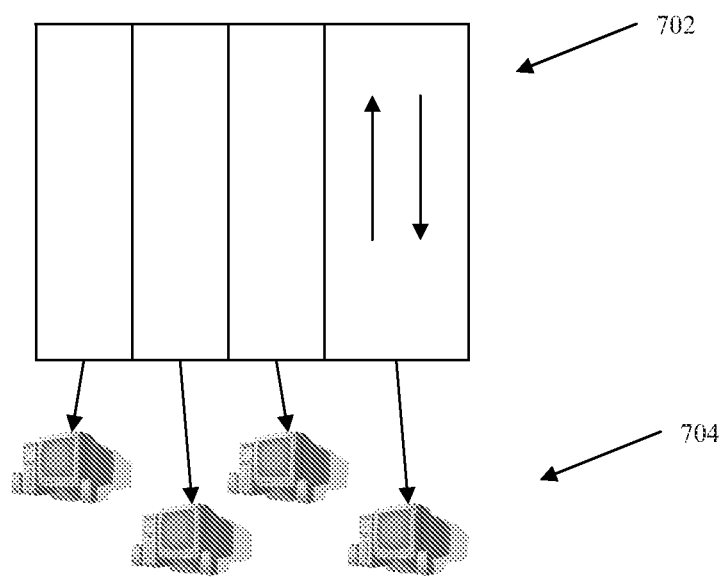
FIG. 7A illustrates an exemplary way of dividing an electronic circuit design or a portion thereof in accordance with a vertical routing direction.

With reference to FIG. 7A which illustrates an exemplary way of dividing an electronic circuit design or a portion thereof in accordance with a vertical routing direction, the electronic circuit design or a portion thereof 702 in this example is divided into four sub-regions and then passed to four slaves 704 for processing in accordance with the processes as described in the preceding paragraphs. It shall be noted that FIG. 7A shows the use of four slaves or one master computing node together with three slaves for illustration and explanation purposes. Nonetheless, more than one sub-region may be passed to a processing node (such as the master computing node or a slave) for further processing. Therefore, the actual number of processing nodes used for further processing may be determined based on one or more factors such as load balancing, performance criteria, etc.

In some embodiments, the routing direction represents a global routing direction or a global preferred routing direction for the electronic circuit design or a portion thereof. In other embodiments, the routing direction represents a local preferred routing direction or a local routing direction for a particular portion or region of the electronic circuit design. In some embodiments, the local preferred routing direction or the local routing direction is different from the global routing direction or the global preferred routing direction. Other embodiments allow the local routing direction or the local preferred routing direction to be the same as the global routing direction or the global preferred routing direction.

In various embodiments, the local preferred routing direction may be defined to increase routing capacity of a particular region to which the local preferred routing direction applies. For example, for a region A that is adjacent to two other regions in which the respective routing directions run in the horizontal and vertical direction, the local routing direction or the local preferred routing direction may be defined to be in an oblique direction such that the routes or tracks may be joined in a more space efficient manner to increase the routing capacity of region A.

In some embodiments, the division of the master region of interest or the hierarchical electronic circuit design is performed along the boundaries of various cells in the area of interest.

In other embodiments, the division of the master region of interest or the hierarchical electronic circuit design into a plurality of sub-regions need not be performed along the boundaries of the cells. In the latter embodiments, the boundaries of the one or more sub-regions need not coincide with the boundaries of certain cells. In other words, the boundaries of the one or more sub-regions may cross the boundaries of some cells.

In various embodiments, the size, composition, or location of the division, the manner of division, or user's preference goals may be determined to meet certain performance criteria. For example, the method or the system may determine to divide the area of interest in the electronic circuit design into more sub-regions if the user desires to complete the processing within a shorter time frame. In this example, the size, composition, or the locations of various sub-regions may be adjusted or determined accordingly to meet the user's performance goals.

Figure 7B:
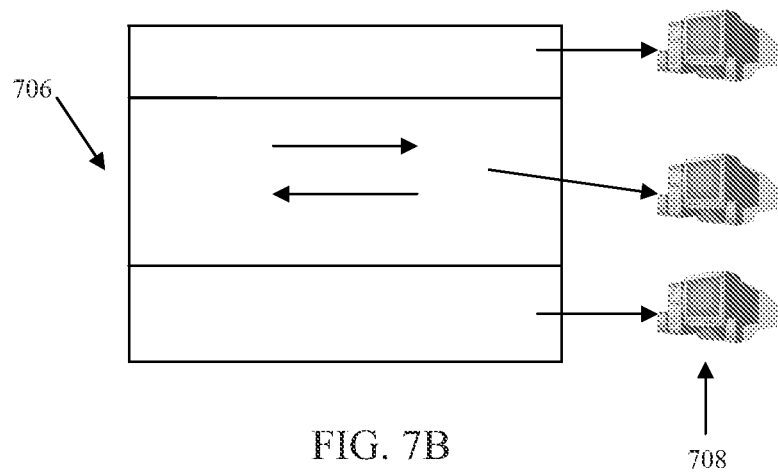
FIG. 7B illustrates an exemplary way of dividing an electronic circuit design or a portion thereof in accordance with a horizontal routing direction.

With reference to FIG. 7B which illustrates an exemplary way of dividing an electronic circuit design or a portion thereof in accordance with a horizontal routing direction, the electronic circuit design or a portion thereof 706 in this example is divided into three sub-regions and then passed to three slaves 708 for further processing in accordance with the processes as described in the preceding paragraphs. It shall be noted that FIG. 7B shows the use of three slaves or one master computing node together with two slaves for illustration and explanation purposes. Nonetheless, more than one sub-region may be passed to a processing node (such as the master computing node or a slave) for further processing. Therefore, the actual number of processing nodes used for further processing may be determined based on one or more factors such as load balancing, performance criteria, etc.

Figure 7C:
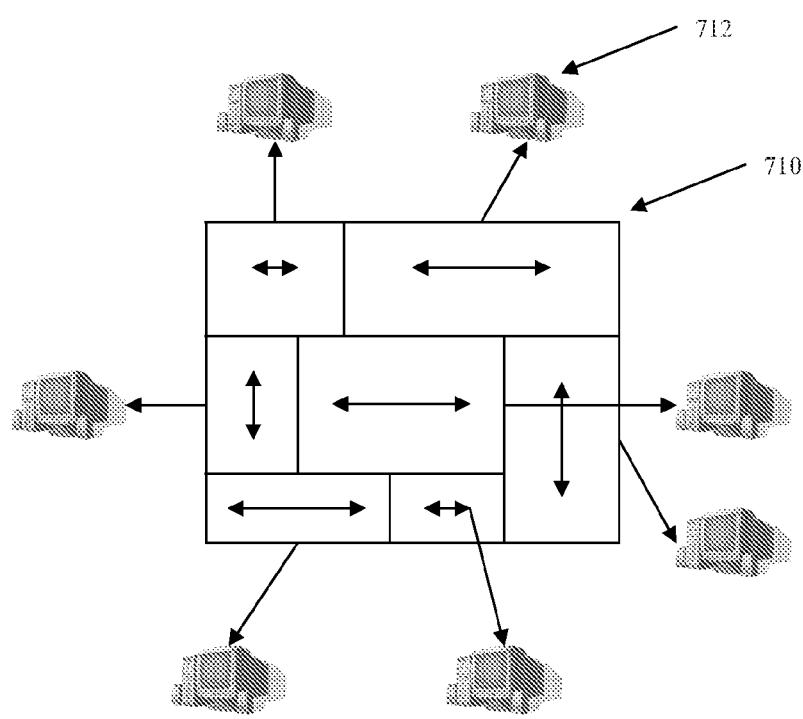
FIG. 7C illustrates an exemplary way of dividing an electronic circuit design or a portion thereof in accordance with both vertical and horizontal routing directions.

With reference to FIG. 7C which illustrates an exemplary way of dividing an electronic circuit design or a portion thereof in accordance with both vertical and horizontal routing directions, the electronic circuit design or a portion thereof 710 is divided into seven sub-regions and passed to seven slaves or one master computing node plus six slaves for further processing in accordance with the processes as described in the preceding paragraphs. It shall be noted that FIG. 7C shows the use of seven slaves or one master computing node together with six slaves for illustration and explanation purposes. Nonetheless, more than one sub-region may be passed to a processing node (such as the master computing node or a slave) for further processing. Therefore, the actual number of processing nodes used for further processing may be determined based on one or more factors such as load balancing, performance criteria, etc.

It shall be further noted that FIGS. 7A-C illustrate the use of Manhattan directions as the routing directions. Nonetheless, the routing directions are not limited to Manhattan directions, and oblique routing directions may also be used.

Once the methods or the systems divide the master region into slices or grids, the methods or the systems may send at least one slice or one grid to each slave or each thread. In some embodiments, there exist no overlapping sub-regions in the slices or grids of the master region that are sent to each thread or each slave to avoid performing the same or similar tasks for the overlapping area more than once. For each thread or each slave, the methods or the systems send the slice(s) or grid(s) that the thread or the slave processes in some embodiments.

The methods or the systems further send the number of levels associated with the task(s) to be performed on the electronic design to each thread or each slave in some embodiments. The methods or the systems may also send a pointer to the master design to each slave or each thread, which has read access to the entire design to produce shapes as required by the task to process or its associated Boolean or other operations. Each thread or slave then writes the output locally in the divided sub-region(s) or slice(s) or grid(s) in some embodiments. When the slave is done and it needs to incorporate its data into the master, the master data is locked at the cellview level while the data is transferred in some embodiments, and therefore multiple slaves or threads may write their respective results to the master simultaneously as long as each slave or each thread is writing the results for different cell views.

In some embodiments, the methods or the systems parallelize the processing of the acts or modules in a scalable multiprocessing such as a single- or multiple-processor system where each processor has multithreading capabilities. In some embodiments, the methods or the systems parallel the acts by utilizing a multiprocessing computing system with multithreading capabilities. For example, the multiprocessing computing system may comprise one or more multithreading central processing units (CPUs) each of which comprises one or more processing cores. In these embodiments where the methods or the systems parallelize the processing of the acts or the modules where all processors have access to a shared memory such as the CPU caches and some look-aside buffers. In some embodiments, the methods or the systems parallelize the processing of the acts or modules using the thread-level parallelism, the instruction-level parallelism, or a combination thereof.

In some embodiments, the methods or the systems distribute the processing of the acts or the modules in a distributed computing environment in which the methods or the systems utilize a distributed computing system which comprises multiple autonomous computers that communicate and interact with each other through a computer network by, for example, exchanging messages between the computers, to achieve common goals. In some embodiments, at least one of the autonomous computers has the multithreading capability. In these embodiments where the methods or the systems distribute the processing of the acts or the modules in a distributed computing environment by utilizing multiple autonomous computers, each of the multiple autonomous computers has its own private memory, which is jointly called a distributed memory.

Figure 6:
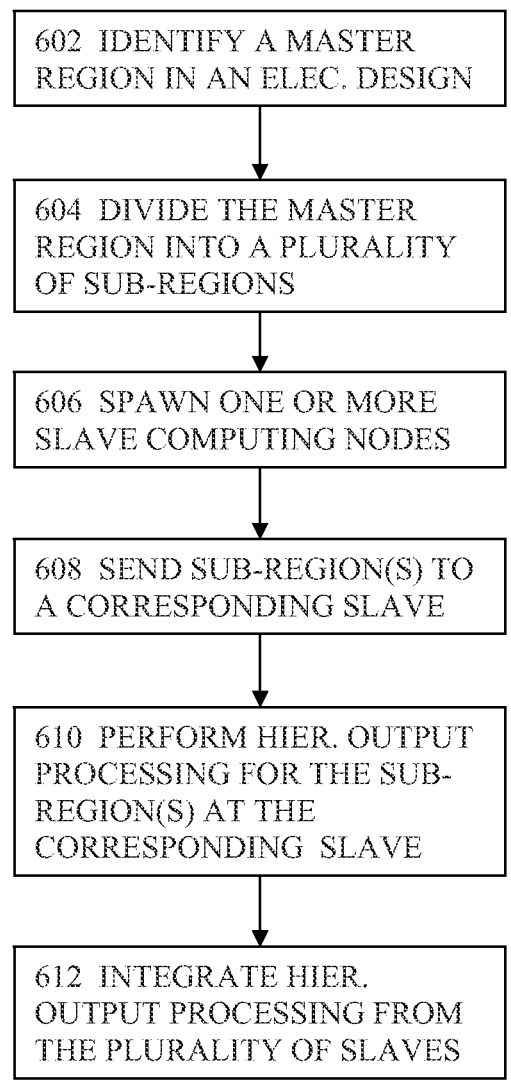
FIG. 6 illustrates a top level diagram for a parallelization architecture that may be used to implement various processes as described in the Application.

With reference to FIG. 6 which illustrates a top level diagram for a parallelization architecture that may be used to implement various processes as described in the Application, the method or the system comprises identifying a master region in the hierarchical electronic circuit design 602 in some embodiments. In these embodiments, the master region may be a portion less then the whole electronic circuit design or may be the entire electronic circuit design.

At 604, the method or the system for generating a hierarchical output for an operation further comprises dividing the master region into a plurality of sub-regions. At 606, the method or the system for generating a hierarchical output for an operation further comprises spawning or initiating one or more slave computing nodes.

In some embodiments, the system comprises a master computing node and one or more computing nodes. In the embodiments where the system comprises a master computing node and one or more slave computing nodes, the master computing node is responsible for dividing the hierarchical electronic circuit design or a portion (such as a master region or a region of interest) into a plurality of sub-regions. The master computing node also spawns and initiates the one or more slave computing nodes 104. More details of dividing the electronic circuit design or a portion thereof are described in greater details in the following paragraphs.

In some embodiments, the system comprises a scalable multithreading parallel system with one or more central processing units (CPUs) where multiple threads share the computing resources such as the computing units, the CPU caches, and the translation look-aside buffer to achieve faster overall execution of the acts by, for example, increasing utilization of a processor core by leveraging thread-level and instruction-level parallelism. In these embodiments, the CPUs may comprise one or more processor cores, and at least one of the process cores is capable of multi-thread computation. In other embodiments, the system may comprise a single computing system with one or more central processing unit (CPU) each of which comprises one or more processing cores, at least one of which is capable of multi-thread computation.

At 608, the method or the system for generating a hierarchical output for an operation comprises sending one or more sub-regions to at least one of the one or more slave computing nodes, at least one of the one or more processing cores, or at least one or more threads (hereinafter one or more slaves collectively) for further performing the processes as illustrated in FIGS. 1-3 and the respective description in the preceding paragraphs.

At 610, the method or the system for generating a hierarchical output for an operation comprises performing hierarchical output processing on the one or more sub-regions at one of the one or more slaves. More details of performing the hierarchical output processing one the one or more sub-regions will be described in greater details in the preceding paragraphs with reference to FIGS. 1-3. At 612, the method or the system for generating a hierarchical output for an operation comprises integrating the results of the hierarchical output processing generated by one of the one or more slaves.

System Architecture Overview

FIG. 8 illustrates a block diagram of an illustrative computing system 800 suitable for implementing various embodiments of the invention. Computer system 800 includes a bus 806 or other communication mechanism for communicating information, which interconnects subsystems and devices, such as processor 807, system memory 808 (e.g., RAM), static storage device 809 (e.g., ROM), disk drive 810 (e.g., magnetic or optical), communication interface 814 (e.g., modem or Ethernet card), display 811 (e.g., CRT or LCD), input device 812 (e.g., keyboard), and cursor control (not shown).

According to one embodiment of the invention, computer system 800 performs specific operations by one or more processors or processor cores 807 executing one or more sequences of one or more instructions contained in system memory 808. Such instructions may be read into system memory 808 from another computer readable/usable storage medium, such as static storage device 809 or disk drive 810. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention. In the single embodiment or in some embodiments, the one or more processors or processor cores 807 may be used to perform various acts in FIGS. 1, 3, 5A-B, and 6A-B such as various acts involving determining, identifying, tessellating, applying, populating, adding, creating, etc. In some embodiments, at least one of the one or more processors or processor cores 807 has the multithreading capability.

Various actions as described in the preceding paragraphs may be performed by using one or more processors, one or more processor cores, or combination thereof 807. For example, the act of determining the inverse transform, the act of performing the operation on the shapes, the act of integrating post operation shapes, the act of tessellating the shapes, the act of applying the inverse transform, or the act of integrating the shapes to the master output layer, etc. may be performed by one or more processors, one or more processor cores, one or more threads, or combination thereof.

The term "computer readable storage medium" or "computer usable storage medium" as used herein refers to any medium that participates in providing instructions to processor 807 for execution. Such a medium may take many forms, including but not limited to, non-volatile media and volatile media. Non-volatile media includes, for example, optical or magnetic disks, such as disk drive 810. Volatile media includes dynamic memory, such as system memory 808.

Common forms of computer readable storage media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read. For example, the various forms of computer readable storage media may be used by the methods or the systems to store either temporarily or permanently information or data such as the one or more master regions, one or more master output layers, one or more global scratch layers, various transforms and inverse transforms, shapes, etc.

In an embodiment of the invention, execution of the sequences of instructions to practice the invention is performed by a single computer system 800. According to other embodiments of the invention, two or more computer systems 800 coupled by communication link 815 (e.g., LAN, PTSN, or wireless network) may perform the sequence of instructions required to practice the invention in coordination with one another.

Computer system 800 may transmit and receive messages, data, and instructions, including program, i.e., application code, through communication link 815 and communication interface 814. Received program code may be executed by processor 807 as it is received, and/or stored in disk drive 810, or other non-volatile storage for later execution. In an embodiment, the computer system 800 operates in conjunction with a data storage system 831, e.g., a data storage system 831 that contains a database 832 that is readily accessible by the computer system 800. The computer system 800 communicates with the data storage system 831 through a data interface 833. A data interface 833, which is coupled to the bus 806, transmits and receives electrical, electromagnetic or optical signals that include data streams representing various types of signal information, e.g., instructions, messages and data. In embodiments of the invention, the functions of the data interface 833 may be performed by the communication interface 814.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for processing a hierarchical electronic circuit design of an electronic circuit, the method comprising:
   using a computer system which comprises at least one processor that executes one or more threads to perform a process, the process comprising:
   identifying a first shape from a first layer and a first scratch layer, wherein the first scratch layer comprises a result of populating a second shape from a second layer;
   identifying a first shape into the first scratch layer to generate a first post-operation shape;
   identifying or generating a master output layer in a computer readable storage medium for a cellview master of an instance in the instance path that the first shape is in, wherein the cellview master exists at a level in the hierarchical electronic circuit design; and
   integrating a derived shape of the first post-operation shape into the master output layer by operating upon the hierarchical electronic circuit design, without flattening design data pertaining to the first layer or the second layer of the electronic circuit, to create the hierarchical output, wherein flattening the design data promotes the design data from a lower hierarchical level to a higher hierarchical level.

2. The computer implemented method of claim 1, wherein the first post-operation shape is determined by performing a logical conjunction between the first shape and the first scratch layer.

3. The computer implemented method of claim 1, wherein the act of populating the second shape comprises clipping a subsequently identified shape on the second layer against a previously identified shape on the second layer or performing a logical disjunction between the subsequently identified shape and the previously identified shape on the second layer.

4. The computer implemented method of claim 1, further comprising:
   generating a first post-clipping shape by performing a clipping operation in a second scratch layer upon the first post-operation shape against one or more shapes that already exist in the second scratch layer.

5. The computer implemented method of claim 1, further comprising:
   tessellating the first post-operation shape or the derived shape of the first post-operation shape into a plurality of tiles.

6. The computer implemented method of claim 5, wherein the derived shape of the first post-operation shape comprises the post-clipping shape.

7. The computer implemented method of claim 1, wherein the act of integrating the derived shape comprises:
   applying an inverse transform to the first post-operation shape or a derived shape or a plurality of tiles of the first post-operation shape; and
   performing an operation on the first post-operation shape or a derived shape or a plurality of tiles of the first post-operation shape that are inversely transformed in the master output layer.

8. The computer implemented method of claim 1, wherein the second shape is located at a first hierarchical level that is same or higher than a second hierarchical level at which the first shape is located in the hierarchical electronic circuit design.

9. The computer implemented method of claim 1, wherein the act of identifying a first shape from a first layer and a first scratch layer comprises:
   identifying a hierarchical level, starting with a lowest hierarchical level in a master region;
   identifying the second shape on the first layer at the hierarchical level;
   integrating the second shape into the first scratch layer; and
   identifying the first shape on the second layer at the hierarchical level in the master region.

10. The computer implemented method of claim 9, further comprising:
    integrating the first shape to a second scratch layer to generate a second post-operation shape; and
    integrating a second derived shape of the second post-operation shape into the master output layer to create the hierarchical output in the master output layer.

11. The computer implemented method of claim 9, further comprising:
    clearing contents of the first scratch layer.

12. The computer implemented method of claim 11, further comprising:
    identifying the hierarchical level, starting with the lowest hierarchical level for the first layer and the second layer in the master region;
    identifying the second shape on the second layer at the hierarchical level;
    integrating the second shape into the first scratch layer to generate the first post-operation shape;
    identifying the first shape on the first layer at the hierarchical level in the master region; and
    integrating the derived shape of the first post-operation shape into the master output layer to create the hierarchical output in the master output layer.

13. The computer implemented method of claim 1, wherein the act of identifying a first shape from a first layer and a first scratch layer comprises:
    identifying all hierarchical levels, starting with the lowest hierarchical level in the master region;
    identifying the second shape on the first layer at the hierarchical level;
    integrating the second shape into the first scratch layer; and
    determining whether there exists a second hierarchical level.

14. The computer implemented method of claim 13, further comprising:
- identifying the all hierarchical levels, starting with the lowest hierarchical level in the master region;
- identifying the first shape on the second layer at each of the all hierarchical levels;
- integrating the first shape into the first scratch layer by performing a clipping or a logical disjunction operation on the first shape;
- integrating the second shape into the first scratch layer to generate a second post-operation shape;
- integrating a second derived shape of the second post-operation shape into the master output layer to create the hierarchical output.

15. An apparatus for processing a hierarchical electronic circuit design, the apparatus comprising:
- a computer which comprises at least one processor that executes one or more threads to:
- identify a first shape from a first layer and a first scratch layer, wherein the first scratch layer comprises a result of populating a second shape from a second layer;
- integrate a first shape into the first scratch layer to generate a first post-operation shape;
- identify or generate a master output layer for a cellview master of an instance path that the first shape is in, wherein the cellview master exists at a level in the hierarchical electronic circuit design; and
- integrate a derived shape of the first post-operation shape into the master output layer by operating upon the hierarchical electronic circuit design, without flattening design data pertaining to the first layer or the second layer of the electronic circuit, to create the hierarchical output, wherein flattening the design data promotes the design data from a lower hierarchical level to a higher hierarchical level.

16. The apparatus of claim 15, wherein the computer is further to:
- generate a first post-clipping shape by performing a clipping operation in a second scratch layer upon the first post-operation shape against one or more shapes that already exist in the second scratch layer.

17. The apparatus of claim 15, wherein the computer is further to:
- tessellate the first post-operation shape or the derived shape of the first post-operation shape into a plurality of tiles.

18. The apparatus of claim 15, wherein the computer is further to:
- apply an inverse transform to the first post-operation shape or a derived shape or a plurality of tiles of the first post-operation shape; and
- perform an operation on the first post-operation shape or a derived shape or a plurality of tiles of the first post-operation shape that are inversely transformed in the master output layer.

19. An article of manufacture of a computer program product comprising a non-transitory computer readable storage medium having a sequence of instructions which, when executed by a computer system, cause at least one processor to execute one or more threads for performing a method for processing a hierarchical electronic circuit design, the method comprising:
- using the computer system which comprises the at least one processor that is configured for executing the one or more threads for performing a process, the process comprising:
- identifying a first shape from a first layer and a first scratch layer, wherein the first scratch layer comprises a result of populating a second shape or shapes from a second layer;
- identifying a first shape into the first scratch layer to generate a first post-operation shape;
- identifying or generating a master output layer for a cellview master of an instance in the instance path that the first shape is in, wherein the cellview master exists at a level in the hierarchical electronic circuit design; and
- integrating a derived shape of the first post-operation shape into the master output layer by operating upon the hierarchical electronic circuit design, without flattening design data pertaining to the first layer or the second layer of the electronic circuit, to create the hierarchical output, wherein flattening the design data promotes the design data from a lower hierarchical level to a higher hierarchical level.

20. The article of manufacture of claim 19, wherein the process further comprises:
- generating a first post-clipping shape by performing a clipping operation in a second scratch layer upon the first post-operation shape against one or more shapes that already exist in the second scratch layer.

21. The article of manufacture of claim 19, wherein the process further comprises:
- tessellating the first post-operation shape or the derived shape of the first post-operation shape into a plurality of tiles.

22. The article of manufacture of claim 19, wherein the process further comprises:
- applying an inverse transform to the first post-operation shape or a derived shape or a plurality of tiles of the first post-operation shape; and
- performing an operation on the first post-operation shape or a derived shape or a plurality of tiles of the first post-operation shape that are inversely transformed in the master output layer.

* * * * *